(12) United States Patent  (10) Patent No.: US 8,542,215 B2
Hanauer et al.  (45) Date of Patent: Sep. 24, 2013

(54) MUTUAL CAPACITANCE MEASUREMENT IN A MULTI-TOUCH INPUT DEVICE

(75) Inventors: Jerry Hanauer, Germantown, WI (US); Todd O'Connor, Menomonee Falls, WI (US)

(73) Assignee: Microchip Technology Incorporated, Chandler, AZ (US)

( * ) Notice: Subject to any disclaimer, the term of this patent is extended or adjusted under 35 U.S.C. 154(b) by 205 days.

(21) Appl. No.: 13/089,786

(22) Filed: Apr. 19, 2011

(65) Prior Publication Data

US 2011/0267309 A1 Nov. 3, 2011

Related U.S. Application Data

(60) Provisional application No. 61/330,229, filed on Apr. 30, 2010.

(51) Int. Cl.
*G06F 3/044* (2006.01)
(52) U.S. Cl.
USPC ............................................ 345/174; 345/173
(58) Field of Classification Search
USPC .................... 345/156–179; 178/18.01, 18.06
See application file for complete search history.

(56) References Cited

U.S. PATENT DOCUMENTS

| 7,663,607 B2 * | 2/2010 | Hotelling et al. ............. 345/173 |
| 2007/0229468 A1 * | 10/2007 | Peng et al. ..................... 345/173 |
| 2008/0048990 A1 * | 2/2008 | Cho et al. ....................... 345/173 |
| 2009/0167325 A1 * | 7/2009 | Geaghan ........................ 324/660 |
| 2009/0284495 A1 * | 11/2009 | Geaghan et al. ............... 345/174 |
| 2010/0051354 A1 * | 3/2010 | Ningrat et al. ............. 178/18.06 |
| 2010/0073301 A1 * | 3/2010 | Yousefpor et al. ............ 345/173 |
| 2011/0216038 A1 * | 9/2011 | Stolov et al. .................. 345/174 |

OTHER PUBLICATIONS

Perme, T., "Introduction to Capacitive Sensing", Microchip AN1101, Microchip Technology Inc., 10 pages, Jul. 12, 2007.
O'Connor, T., "mTouch Projected Capacitive Touch Screen Sensing Theory of Operation", TB3064 Microchip Technology Inc., 16 pages, Aug. 24, 2010.
Rekimoto, J., "SmartSkin: An Infrastructure for Freehand Manipulation on Interactive Surfaces", CH12002: Changing the World, Changing Ourselves, vol. 4., No. 1; 8 pages, Apr. 20, 2002.
International PCT Search Report and Written Opinion, PCT/US2011/034236, 16 pages, Mailed Sep. 30, 2011.

* cited by examiner

*Primary Examiner* — William Boddie
*Assistant Examiner* — Mansour M Said
(74) *Attorney, Agent, or Firm* — Keating & Spalding L.L.P.

(57) ABSTRACT

Systems and methods for determining multiple touch events in a multi-touch sensor system are provided. The system may include a capacitance measurement unit, a pulse drive unit, and a touch sensor having a plurality of nodes and a plurality of electrodes comprising at least two sets of electrodes. The method may include connecting a first electrode in a first set to the capacitance measurement unit, the pulse drive unit driving a voltage or current pulse onto a second electrode in a second set of electrodes. The method may further include the capacitance measurement unit measuring the mutual capacitance at a node corresponding to the first and second electrodes. The method may include comparing the measured mutual capacitance at the node with a previously measured mutual capacitance for the node, and reporting that the node has been touched if there has been a deviation from the previously measured mutual capacitance.

24 Claims, 22 Drawing Sheets

MUTUAL CAPACITANCE MEASUREMENT IN A MULTI-TOUCH INPUT DEVICE

CROSS-REFERENCE TO RELATED APPLICATIONS

This application claims the benefit of U.S. Provisional Application No. 61/330,229 filed on Apr. 30, 2010, entitled "MUTUAL CAPACITANCE MEASUREMENT IN A MULTI-TOUCH INPUT DEVICE," which is incorporated herein in its entirety.

TECHNICAL FIELD

The present disclosure relates to capacitive touch sensor systems, and more particularly, to improved methods of performing mutual capacitance measurements to unambiguously detect one or more objects in contact with the surface of a touch sensor.

BACKGROUND

Capacitive touch sensors are used as a user interface to electronic equipment, for example, computers, mobile phones, personal portable media players, calculators, telephones, cash registers, gasoline pumps, etc. In some applications, opaque touch sensors provide soft key functionality. In other applications, transparent touch sensors overlay a display to allow the user to interact, via touch, with objects on the display. Such objects may be in the form of soft keys, menus, and other objects on the display. The capacitive touch sensors are activated (controls a signal indicating activation) by a change in capacitance of the capacitive touch sensor when an object, for example, a user's finger tip, causes the capacitance thereof to change.

Today's capacitive touch sensors typically come in one of two varieties: single-touch and multi-touch. A single-touch sensor detects and reports the position of one object in contact with the touch sensor. A multi-touch sensor detects the position of one or more objects in simultaneous contact with the touch sensor, and reports distinct position information related to each object. While both single- and multi-touch capacitive sensors have been around for some time, products using single-touch capacitive sensors have, until recent years, been much more prevalent. As a result, many off-the-shelf touch screen controller products, including integrated circuits and the like, are available for use in single-touch sensor systems.

For example, in a touch sensor utilizing an X-Y or grid-like arrangement of electrodes on different layers, current off-the-shelf touch controllers use various forms of self capacitance measurements to determine the location of touch. A self capacitance measurement measures the capacitance of individual electrodes within a touch sensor and determines the position of touch based on the electrode(s) experiencing the most significant change in capacitance. For example, using an X-Y grid, a touch controller iterates through each of the X-axis and Y-axis electrodes, selecting one electrode at a time and measuring its capacitance. The position of touch is determined by the intersection of (1) the X-axis electrode experiencing the most significant capacitance change and (2) the Y-axis electrode experiencing the most significant capacitance change.

Currently, self capacitance measurements may be taken by, for example, a relaxation oscillator-based measurement or a charge time-to-voltage measurement. For example, the Capacitive Sensing Module (CSM) on certain PIC microcontrollers manufactured by Microchip Technology, Inc. implements a relaxation oscillator circuit for measuring self capacitance in a single-touch sensor system. In addition, the Charge Time Measurement Unit (CTMU) on certain PIC microcontrollers manufactured by Microchip Technology, Inc. implements a charge time-to-voltage circuit for measuring self capacitance in a single-touch sensor system. Both the CSM and CTMU have gained widespread acceptance for use in single-touch sensor systems, and both provide a reasonably fast system response time.

However, traditional self capacitance methods (for example, those used by the CSM and CTMU) cannot support the tracking of multiple simultaneous (X,Y) coordinates, as required in a multi-touch sensor system. For example, in a 16×16 electrode grid, the simultaneous touch by one object at position (1,5) and a second object at position (4,10) leads to four possible touch locations: (1,5), (1,10), (4,5), and (4,10). A self-capacitance system is able to determine that X-axis electrodes 1 and 4 have been touched and that Y-axis electrodes 5 and 10 have been touched, but it is not capable of disambiguating to determine which two of the four possible locations represent the actual touch positions.

Multi-touch capacitive sensors, on the other hand, have only recently gained popularity as a result of technological advancements (e.g., faster processors, lower power consumption requirements, etc.) that have enabled the mainstream deployment of sophisticated personal media devices, cell phones, and the like. While new multi-touch touch sensor controller products are becoming available, they tend to rely on new methods developed specifically in response to the increased demand for multi-touch capability. However, these methods are not as mature as those employed for single-touch sensor systems, resulting in less familiarity and longer development times for those wishing to produce a multi-touch sensor.

Therefore, it is desirable to have a method for detecting multiple touches in a multi-touch sensor system that is easy to implement and that requires minimal time to develop. According to the teachings of this disclosure, this is accomplished by improving methods previously used in single-touch sensor systems so that they may be used in multi-touch sensor systems without the aforementioned ambiguity problem. More specifically, the relaxation oscillator-based and charge time-to-voltage-based measurements described above may be improved and adapted to work in a multi-touch sensor system utilizing mutual capacitance measurements.

SUMMARY

In accordance with one embodiment of the present disclosure, a method for determining multiple touch events in a multi-touch sensor system is provided. The system may have a capacitance measurement unit, a pulse drive unit, and a touch sensor having a plurality of nodes and a plurality of electrodes comprising at least two sets of electrodes. The method may include connecting a first electrode in a first set of electrodes to the capacitance measurement unit; and driving, with the pulse drive unit, a voltage or current pulse onto a second electrode in a second set of electrodes. The method may further include measuring, with the capacitance measurement unit, the mutual capacitance at a node corresponding to the first and second electrodes. The method may additionally include comparing the measured mutual capacitance at the node with a previously measured mutual capacitance corresponding to the node. The method may further include reporting that the node has been touched if there has been a deviation from the previously measured mutual capacitance.

In one embodiment of the method, the capacitance measurement unit may comprise a relaxation oscillator circuit, and the step of connecting may further comprise connecting the first electrode to the relaxation oscillator circuit. In this embodiment, the pulse drive unit may drive the voltage or current pulse onto the second electrode each time the relaxation oscillator circuit transitions from a charging state to a discharging state. The measuring step of this embodiment of this embodiment of the method may further comprise measuring a frequency of the relaxation oscillator circuit. The comparing step of this embodiment of the method may further comprise comparing the frequency to a previously measured frequency corresponding to the node and determining whether the frequency deviates from the previously measured frequency. The reporting step of this embodiment of the method may further comprise reporting that the node has been touched if there has been a deviation from the previously measured frequency.

In accordance with an alternative embodiment of the method, the multi-touch sensor system may further comprise a timer, and the capacitance measurement unit may comprise a voltage or current source. The connecting step of this alternative embodiment of the method may further comprise connecting the first electrode to the voltage or current source. Additionally, in this alternative embodiment, the pulse drive unit may drive the voltage or current pulse onto the second electrode while the voltage or current source is connected to the first electrode. The measuring step of this alternative embodiment of the method may further comprise starting the timer and measuring the voltage of the first electrode as a measured voltage when the timer reaches a pre-determined time. The comparing step of this alternative embodiment of the method may further comprise comparing the measured voltage to a previously measured voltage corresponding to the node. The reporting step of this alternative embodiment of the method may further comprise reporting that the node has been touched if the measured voltage deviates from the previously measured voltage.

In accordance with an additional alternative embodiment of the method, the multi-touch sensor system may further comprise a timer having a time value, and the capacitance measurement unit may comprise a voltage or current source. The connecting step of this alternative embodiment of the method may further comprise connecting the first electrode to the voltage or current source. Additionally, in this alternative embodiment, the pulse drive unit may drive the voltage or current pulse onto the second electrode while the voltage or current source is connected to the first electrode. The measuring step of this alternative embodiment of the method may further comprise starting the timer, measuring the voltage of the first electrode as a measured voltage, and storing the time value of the timer when the measured voltage reaches a pre-determined voltage level. The comparing step of this alternative embodiment of the method may further comprise comparing the stored time value to a previously stored value corresponding to the node. The reporting step of this alternative embodiment of the method may further comprise reporting that a node corresponding to the first and second electrodes has been touched if the stored time value deviates from the previously stored value.

In accordance with another embodiment of the present disclosure, a system for detecting one or more touch events on a touch sensor may be provided. The system may comprise a touch sensor that may have a plurality of electrodes that may comprise at least a first and second set of electrodes, wherein a proximity between electrodes in different sets may define a plurality of nodes. The system may further comprise a pulse drive circuit that may be operable to provide a charging or discharging voltage or current to the plurality of electrodes. Additionally, the system may comprise capacitance measuring means that may measure the mutual capacitance at each of the plurality of nodes. The system may also comprise a reporting means that may report a touched node based on the measured mutual capacitance of that node.

In accordance with a further embodiment of the present disclosure, a system for detecting one or more touch events on a touch sensor is provided. The system may comprise a touch sensor that may have a plurality of nodes and a plurality of electrodes that may comprise at least a first and second set of electrodes. The system may further comprise a touch controller that may have a pulse drive circuit selectably coupled to the plurality of electrodes, and a capacitance measurement unit selectably coupled to the plurality of electrodes. The touch controller may be operable to measure the mutual capacitance at a node corresponding to a first electrode in the first set of electrodes and a second electrode in the second set of electrodes. The touch controller may be further operable to compare the mutual capacitance at the node with a previously measured mutual capacitance corresponding to the node. Additionally, the touch controller may be operable to report that the node has been touched if there has been a deviation from the previously measured mutual capacitance.

In one embodiment of the system, the capacitance measurement unit may comprise a charge time measurement circuit. In this embodiment, the touch controller may further comprise a timer circuit coupled to the charge time measurement circuit, and a storage element coupled to the charge time measurement circuit. The touch controller of this embodiment may be operable to measure a mutual capacitance at a node by (1) coupling a voltage or current source in the charge time measurement circuit to the first electrode, (2) starting the timer circuit, (3) coupling the second electrode to the pulse drive circuit, and (4) measuring the voltage of the first electrode as a measured voltage when the timer circuit reaches a predetermined time. The touch controller of this embodiment may compare the mutual capacitance at the node by comparing the measured voltage to a previously measured voltage corresponding to the node. The touch controller of this embodiment may further report that the node has been touched if there has been a deviation from the previously measured mutual capacitance.

In accordance with an alternative embodiment of the system, the capacitance measurement unit may comprise a charge time measurement circuit. In this alternative embodiment, the touch controller may further comprise a timer circuit coupled to the charge time measurement circuit, and a storage element coupled to the charge time measurement circuit. The touch controller may be operable to measure the mutual capacitance at a node by (1) coupling a voltage or current source in the charge time measurement circuit to the first electrode, (2) starting the timer circuit, (3) coupling the second electrode to the pulse drive circuit, and (4) measuring the voltage of the first electrode as a measured voltage when the timer circuit reaches a predetermined time. The touch controller of this alternative embodiment may compare the mutual capacitance at the node by comparing the measured voltage to a previously measured voltage corresponding to the node. The touch controller of this alternative embodiment may further report that the node corresponding has been touched if the measured voltage deviates from the previously measured voltage.

In accordance with an additional alternative embodiment of the system, the capacitance measurement unit may comprise a charge time measurement circuit. In this additional alternative embodiment, the touch controller may further comprise a timer circuit having a time value coupled to the charge time measurement circuit, and a storage element coupled to the charge time measurement circuit. The touch controller may be operable to measure the mutual capacitance at a node by (1) coupling a voltage or current source in the charge time measurement circuit to the first electrode, (2) starting the timer circuit, (3) coupling the second electrode to the pulse drive circuit, (4) measuring the voltage of the first electrode as a measured voltage, and (5) storing, in the storage element, the time value of the timer circuit when the measured voltage reaches a predetermined voltage level. The touch controller of this additional alternative embodiment may compare the mutual capacitance at the node by comparing the stored time value to a previously stored time value corresponding to the node. The touch controller of this additional alternative embodiment may further report that the node corresponding has been touched if the stored time value deviates from the previously stored time value.

BRIEF DESCRIPTION OF THE DRAWINGS

A more complete understanding of the present embodiments and advantages thereof may be acquired by referring to the following description in conjunction with the accompanying drawings, in which like reference numbers indicate like features, and wherein.

DETAILED DESCRIPTION

Figure 1:
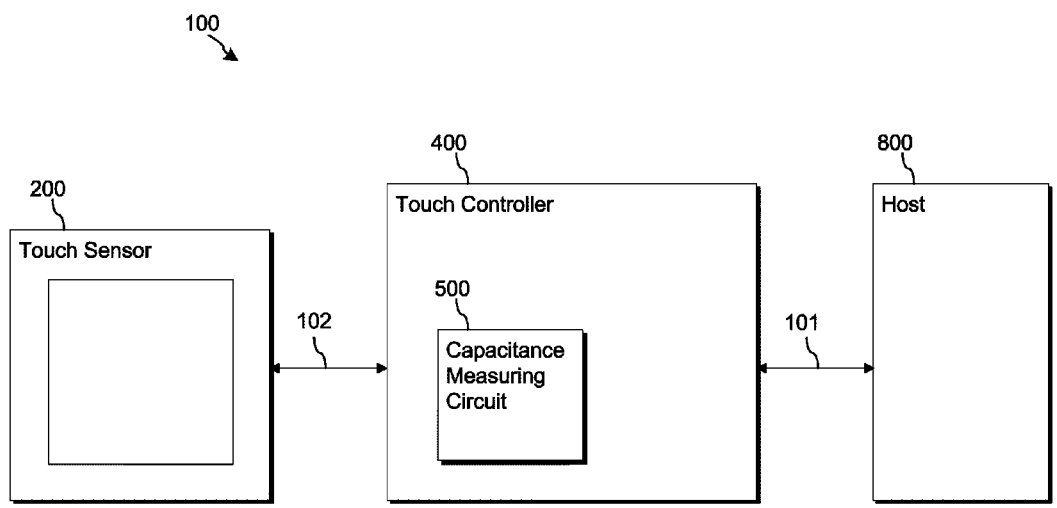
FIG. 1 illustrates a block diagram of an example touch sensor system for detecting multiple touches on a touch sensor, in accordance with the present disclosure.

Preferred embodiments and their advantages over the prior art are best understood by reference to FIGS. 1-17 below, wherein like numbers are used to indicate like and corresponding parts.

In the X-Y grid touch sensor, mutual capacitance refers to the capacitive coupling between an X-axis and a Y-axis electrode. Electrodes on one layer of the touch screen may serve as receivers and the electrodes on the other layer may serve as transmitters. The driven signal on the transmitter electrode may alter the capacitive measurement taken on the receiver electrode because the two electrodes are coupled through the mutual capacitance. In this manner, the mutual capacitance measurement may not encounter the ambiguity problems associated with self capacitance, as mutual capacitance can effectively address every X-Y intersection (node) on the touch sensor.

One embodiment of the disclosure utilizes a relaxation oscillator to measure the mutual capacitance of the nodes of a touch sensor. According to this embodiment, an electrode on the one layer of the touch sensor may act as a receiver and may be connected to the output of a relaxation circuit. Accordingly, the relaxation oscillator circuit may oscillate at some frequency dependent on the capacitance of the connected receiver electrode. Next, a transmitter electrode may be selected on the sensor's other layer and it may be driven with a short voltage or current pulse each time the relaxation oscillator flips from a charging to a discharging state. This voltage pulse may act to inject current into the receiver electrode's capacitive load, which may slow down the relaxation oscillator frequency as a result of the pulse injection being synchronized with the discharge state of the relaxation oscillator.

A finger touch near the intersection of the receiver and transmitter electrode may provide a capacitively-coupled touch shunting path for some of the pulse that is injected into the circuit via the transmitter electrode. Thus, the touch may effectively steal some of the pulse-injected current, which may result in a measurable deviation in the frequency of the relaxation oscillator. The deviation may represent an increase or decrease in the frequency dependent upon the phase of the transmitter pulse in relation to the phase of the relaxation oscillator output. The touch controller may measure the mutual capacitance by, for example, measuring the time duration needed for a defined number of relaxation cycles to occur for a given receiver/transmitter electrode pair. This measurement may be repeated until each electrode on one layer has served as a transmitter for a given receiver electrode on the other layer, and until each electrode one the other layer has served as a receiver electrode. The node(s) experiencing a change above a pre-determined threshold (as compared to a no-touch or baseline measurement) may be reported as a touched node/position.

The above-described method using a relaxation oscillator-based system may use the CSM module available on certain PIC microcontrollers manufactured by Microchip Technologies, Inc.

Another embodiment of the disclosure may measure the charge time-to-voltage relationship for the capacitive load. This approach may operate according to the principle that the voltage at a defined charge time may be dependent on the capacitance of a connected electrode. Thus, the voltage at a defined charge time may change when a touch is introduced near the sensing electrode because the touch may change the total capacitance presented by the electrode. Two different methods may be used to measure the charge time-to-voltage relationship. In the first method, a capacitive load (for example, an electrode) may be connected to a charging voltage at the same time that a timer is started. After a fixed delay, the system may measure the voltage across the capacitive load (for example, an electrode). If the capacitance has increased due to a touch, the voltage may be lower than in the no-touch condition. Using the second method, a capacitive load (for example, an electrode) may be connected to a charging voltage at the same time that a timer is started. The system may wait until a pre-defined voltage level is achieved across the capacitor (for example, an electrode), at which time the timer may be stopped. If the capacitance has increased due to a touch, the time taken to charge the electrode to the pre-defined voltage level may have increased compared to the no-touch condition.

Thus, according to the charge time-to-voltage embodiment of this disclosure, an electrode on one layer of the touch sensor may act as a receiver and may be connected to the output of the charge time-to-voltage circuit. Accordingly, the charge voltage may be dependent on the capacitance of the connected receiver electrode. Next, a transmitter electrode may be selected on the sensor's other layer and it may be driven with a short voltage or current pulse while the charge time-to-voltage circuit is charging. This voltage pulse may act to inject current into the receiver electrode's capacitive load, which may increase the circuit's voltage.

A finger touch near the intersection of the receiver and transmitter electrode may provide a capacitively-coupled touch shunting path for some of the pulse-injected current that is injected into the circuit via the transmitter electrode. Thus, the touch may effectively steal some of the pulse-injected current, which may result in a measurable decrease in the charge voltage. The touch controller may measure the mutual capacitance according to one of the two methods described above (pre-defined time delay or pre-defined voltage level). This measurement may be repeated until each electrode on one layer has served as a transmitter for a given receiver electrode on the other layer, and until each electrode on the other layer has served as a receiver electrode. The node(s) experiencing a change above a pre-determined threshold (as compared to a no-touch or baseline measurement) may be reported as a touched position.

The above-described methods using a charge time-to-voltage-based system may use the CTMU module available on certain PIC microcontrollers manufactured by Microchip Technologies, Inc.

FIG. 1 illustrates a block diagram of an example touch sensor system 100 for detecting multiple touches on a touch sensor, in accordance with the present disclosure. As depicted in FIG. 1, system 100 may comprise touch sensor 200, touch controller 400, and host 800.

Touch sensor 200 may generally be operable to receive input via contact with a human finger or other hand held object (e.g., stylus, credit card, etc.). In general, touch sensor 200 is configured to recognize a touch event through a change in capacitance that results from the touch event. Touch sensor 200 may include one or more conductive elements that present a natural capacitance to a ground (or virtual ground) plane within touch sensor 200. Touch sensor 200 may be of a semi-transparent construction, allowing it to be placed in front of or integrated into a graphic (video) display system. Alternatively, touch sensor 200 may be of an opaque construction (e.g., touch pad used in many current laptop computers). A more detailed description of an example touch sensor 200 according to the present disclosure is provided in the discussion of FIGS. 2-5 below.

Touch controller 400 may generally be an electronic system operable to detect, measure, and report touch events on touch sensor 200. Touch controller 400 may comprise capacitance measuring circuit 500. According to certain exemplary embodiments, capacitance measuring circuit 500 may comprise a relaxation oscillator circuit 500 in the form of an electronic circuit that produces a voltage signal that oscillates between two voltage levels. In alternative embodiments, capacitance measuring circuit 500 may comprise a charge time measurement unit in the form of an electronic circuit that provides a charging voltage or current and a timer. Touch controller 400 may be implemented as discrete electrical components, as a part of an integrated circuit, or some combination of both. A more detailed description of an example touch controller 400 according to the present disclosure is provided in the discussion of FIGS. 6-14 below.

Host 800 may generally be a system that receives touch reports from touch controller 400. Host 800 may be configured to initiate some action based on such touch reports. In one embodiment, host 800 may correspond to a computer such as a server, desktop, laptop, or tablet computer. According to another embodiment, host 800 may correspond to any of a variety of electronic devices including, for example, a mobile phone or a digital media (e.g., music, video, etc.) player.

As illustrated in FIG. 1, touch sensor 200, touch controller 400, and host 800 may be communicatively coupled via connections 101 and 102 to form system 100. Connections 101 and 102 may be any type of structure suitable for facilitating the communication of electronic signals, data, and/or messages (generally referred to as data). In addition, touch sensor 200, touch controller 400, and host 800 may communicate via connections 101 and 102 using any suitable communication protocol. In one embodiment, communication over connections 101 and 102 may be in the form of a custom communication protocol. According to another embodiment, communication over connections 101 and 102 may be according to any of a variety of known protocols/bus architectures. For example, such protocols/architectures may include, but are not limited to, I$^2$C, SPI, RS232/UART, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, Universal Serial Bus (USB), Video Electronics Standards Association (VESA) local bus, Internet protocol (IP), other packet-based protocol, small computer system interface (SCSI), Internet SCSI (iSCSI), Serial Attached SCSI (SAS) or any other transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof.

While touch sensor 200, touch controller 400, and host 800 are depicted as separate blocks in FIG. 1, any physical configuration may be provided. For example, in one embodiment touch controller 400 and host 800 may be implemented as a single integrated circuit. In another embodiment, touch controller 400 and touch sensor 200 may be implemented as a standalone device separate from host 800. In yet another embodiment, touch sensor 200, touch controller 400, and host 800 may be implemented as one physical device with connections 101 and 102 as internal connections within the device. For embodiments including more than one physical device corresponding to touch sensor 200, touch controller 400, and host 800, the physical devices may be physically located at the same location or at remote locations. For example, connection 101 may be the internet and host 800 may be a server computer located many miles away from touch sensor 200 and touch controller 400.

In operation, touch controller 400 may use capacitance measuring circuit 500 and other circuitry to continually measure, via connection 102, the capacitance value of one or more conductive elements within touch sensor 200. When a user touches touch sensor 200 with one or more fingers or other objects, the touches change the capacitance value at conductive element(s) near the touch location(s). Touch controller 400 may recognize the changed capacitance and determine that the touch sensor 200 has been touched. Accordingly touch controller 400 may determine the location(s) of the touch(es) or the specific conductive element that was touched. Touch controller 400 may then report the touch location(s) to host 800. Host 800 may initiate some action based in whole or in part on the location(s) of the touch.

Figure 2:
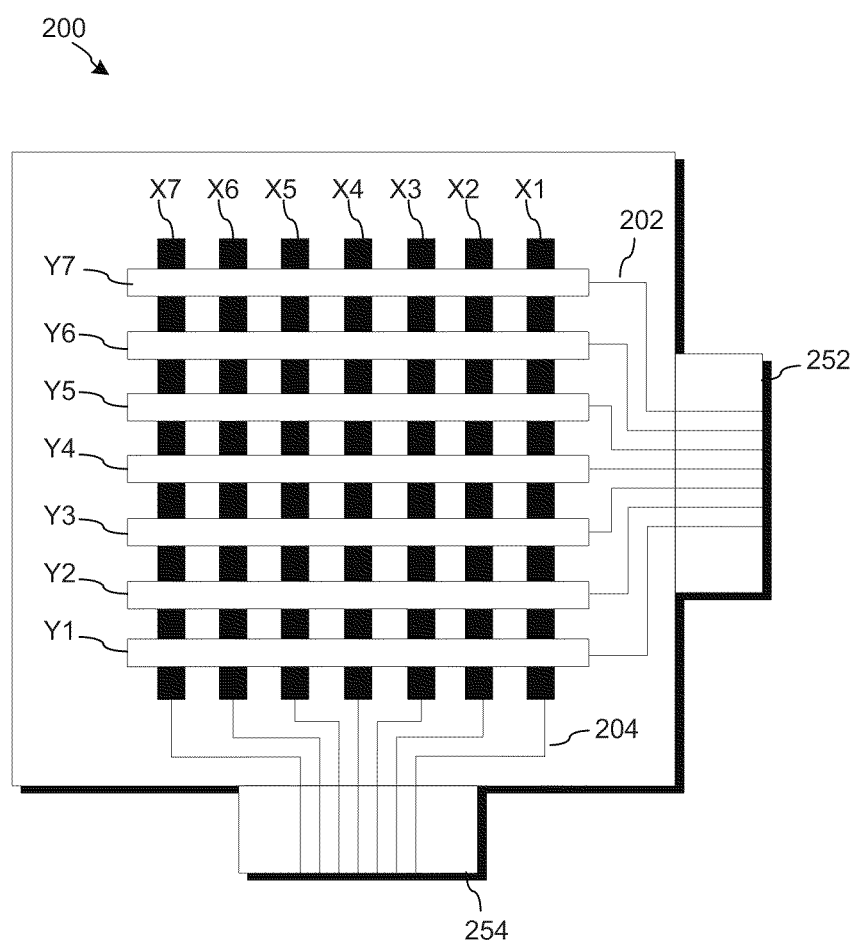
FIG. 2 illustrates a top view of an example touch sensor for detecting multiple touches, in accordance with the present disclosure.

FIG. 2 illustrates a top view of an example touch sensor 200 for detecting multiple touches in touch sensor system 100, in accordance with the present disclosure. According to the depicted embodiment, touch sensor 200 may include dielectrically separated conductive elements X1-X7 and Y1-Y7 arranged in a grid pattern and forming a Cartesian coordinate system (x and y) in which each conductive element represents a different x or y coordinate. According to another embodiment, touch sensor 200 may include conductive elements arranged according to a Polar coordinate system or some other coordinate system. In one alternative embodiment, a completely arbitrary and/or proprietary coordinate system may be chosen (for example, something other than a Cartesian or Polar coordinate system). According to the depicted embodiment, conductive elements X1-X7 and Y1-Y7 may be of uniform width along the length of the each conductive element. According to alternative embodiments, conductive elements X1-X7 and Y1-Y7 may have a width that varies along the length of each conductive element. For example, a conductive element in one layer (for example, the X-layer) may be less wide at the point where it intersects with a conductive element in the other layer (for example, the Y-layer) compared to its width at non-intersecting areas along its length. An example of this latter type of touch sensor is depicted as touch sensor 260 in FIG. 2a, which illustrates conductors arranged according to an interleaved diamond pattern.

Each of conductive elements X1-X7 and Y1-Y7 in FIG. 2 may be electrically connected via traces 202 and 204 to ports 252 and 254. In the embodiment shown, each conductive element is separately and directly connected to a respective one of ports 252 and 254. According to another embodiment, traces 202 and 204 may be connected directly or indirectly (e.g., with intervening logic) to more than one of conductive elements X1-X7 and Y1-Y7. While similar traces and ports are not depicted in touch sensor 280 of FIG. 2a, one of ordinary skill in the art would understand that these features may be utilized in touch sensor 280.

Figure 2A:
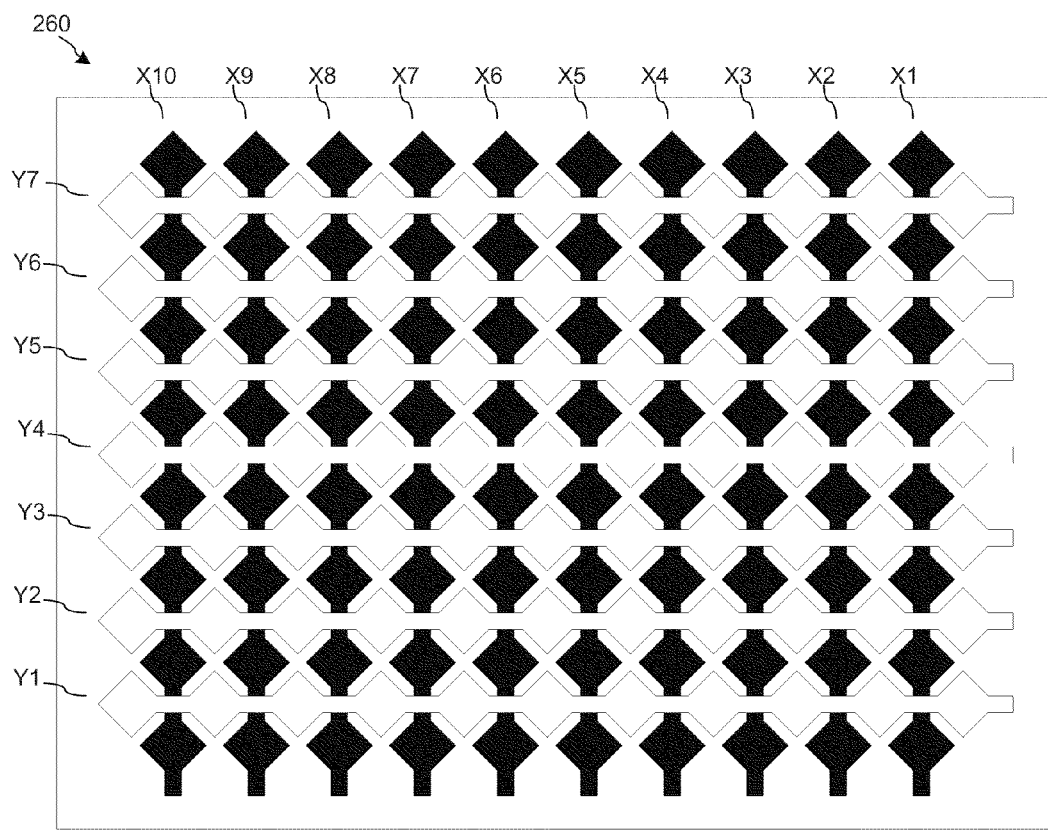
FIG. 2a illustrates a top view of an example touch sensor for detecting multiple touches, in accordance with the present disclosure.

Conductive elements X1-X7/X10 and Y1-Y7 in FIGS. 2 and 2a may be formed with any suitable conductive medium. In a semi-transparent touch sensor configuration, capacitive elements X1-X7/X10 and Y1-Y7 may be formed with, for example, indium tin oxide (ITO). In an opaque touch sensor configuration, capacitive elements X1-X7/X10 and Y1-Y7 may be formed with, for example, copper.

Ports 252 and 254 may provide an interface to which the touch controller 400 of FIG. 1 may be coupled (via connection 102). While the disclosed embodiment includes one port 252 corresponding to conductive elements Y1-Y7 and a separate port 254 corresponding to conductive elements X1-X7, other embodiments may comprise a single port or more than two ports. In these cases, traces 202 and 204 may be routed to the desired port(s).

Figure 2B:
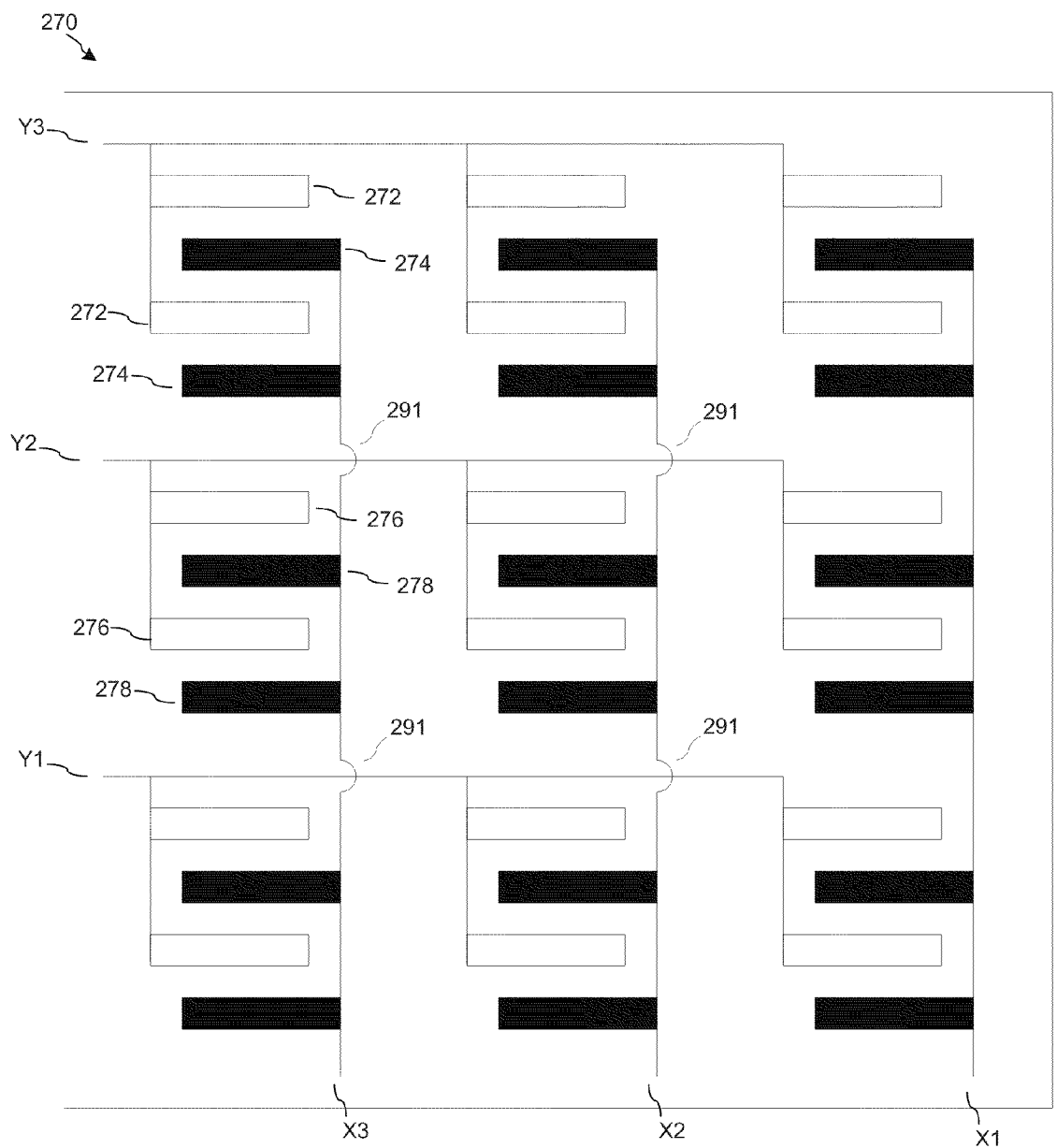
FIG. 2b illustrates a top view of an example touch sensor for detecting multiple touches, in accordance with the present disclosure.

FIG. 2b illustrates a top view of an example touch sensor 270 for detecting multiple touches in touch sensor system 100, in accordance with the present disclosure. According to the depicted embodiment, touch sensor 270 may include dielectrically separated conductive elements X1-X3 and Y1-Y3. According to this embodiment, conductive elements 272 on the Y-axis may be positioned adjacent to conductive elements 274 on the X-axis. In this embodiment, the X- and Y-axis conductive elements may be on the same physical layer, rather than intersecting on different layers. In this manner, construction of touch sensor 270 may be simplified. Accordingly, the conductive elements X1-X3 and Y1-Y3 may be arranged in a grid pattern (as depicted), such that X-axis elements 274 and Y-axis elements 272 may represent coordinate node (X3, Y3) in a Cartesian coordinate system. Similarly, X-axis elements 278 and Y-axis elements 276 may represent coordinate or node (X3, Y2). According to another embodiment, touch sensor 270 may include similar conductive elements arranged on the same physical layer according to a Polar coordinate system or some other arbitrary or proprietary coordinate system. In one or all of the above-described embodiments of touch sensor 270, cross over locations 291 may require electrical separation. However, these cross over locations may be construction motivated, such that they do not represent regions where the capacitance is measured. Rather, capacitance at or between conductive elements 272 and 274 may be measured to determine whether a touch has occurred at coordinate or node (X3, Y3).

Figure 3:
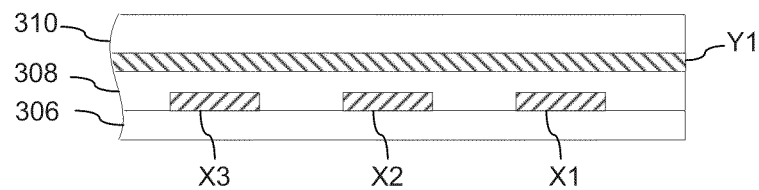
FIG. 3 illustrates a partial cross-section, front elevation view of an example touch sensor, in accordance with the present disclosure.
Figure 4:
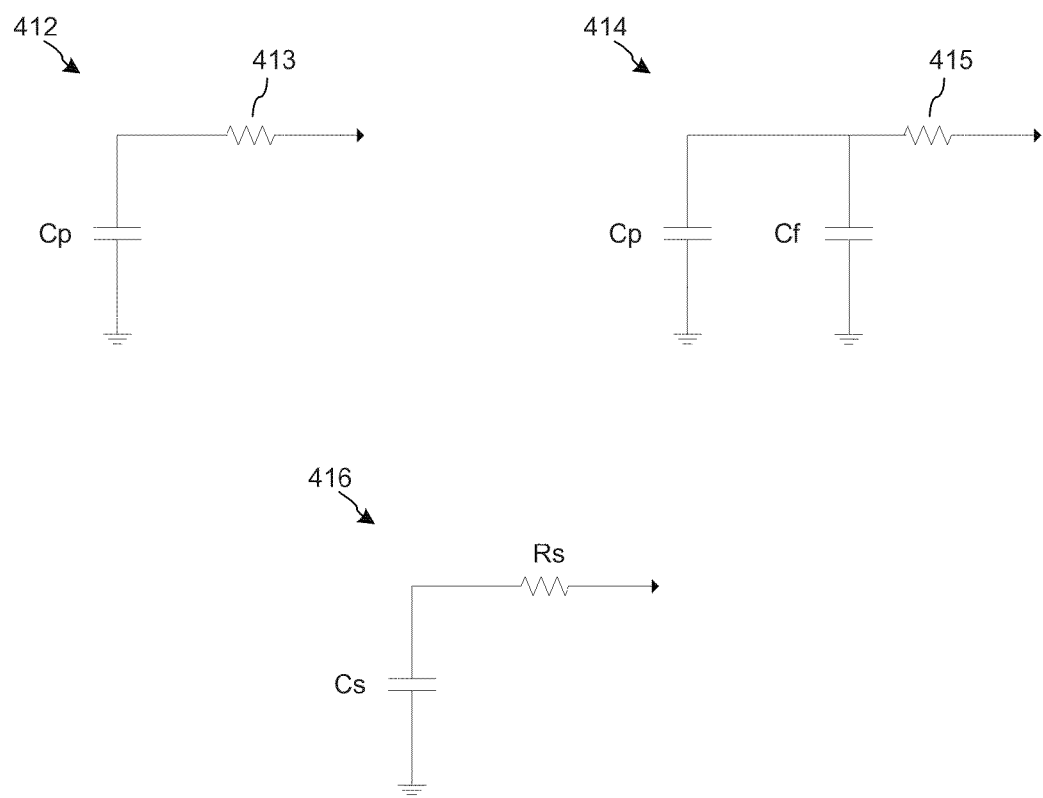
FIG. 4 illustrates electrical circuits corresponding to an example touch sensor in a touch sensor system, in accordance with the present disclosure.

FIG. 3 illustrates a partial cross-section, front elevation view of an example touch sensor 200 in touch sensor system 100, in accordance with exemplary embodiments of the present disclosure. For example, FIG. 3 may correspond to multi-layer touch screens 200 and 260 depicted in FIGS. 2 and 2a. As depicted in FIG. 3, touch sensor 200 may comprise substrate layer 306 onto which conductive elements X1-X3 are formed. Insulating layer 308 may dielectrically separate conductive elements X1-X3 from conductive element Y1. Surface layer 310 may be formed on top of conductive element Y1 and provide the input surface of touch screen 200 (that is, the surface that the user touches with a finger or other object). In a semi-transparent touch sensor configuration, substrate 306 and surface layer 310 may be formed with, for example, glass or clear plastic (for example, Plexiglas, PET (polyester), etc.); and insulating layer 308 may be formed with, for example, a clear adhesive or other semi-transparent materials having good insulating characteristics. In an opaque touch sensor configuration, substrate 306 may be formed with, for example, a fiberglass (FR-4) printed circuit board (PCB) material; insulating layer 308 may be formed with, for example, any suitable adhesive or other material having good insulating characteristics; and surface layer 310 may be formed with, for example, glass or plastic. While FIG. 3 provides one exemplary embodiment of the construction of touch sensor 200, many other embodiments are possible and would be known to one of ordinary skill in the art. In addition, the assignment of the "X" layer and "Y" layer in FIGS. 2, 2a, 2b, and 3 are arbitrary assignments, and should not be read as a limitation.

In all of FIGS. 2, 2a, 2b, and 3, the proximity, adjacency, spatial relation, or proximate relationship between different sets of electrodes (for example, sets of "X" electrodes in relation to sets of "Y" electrodes) may act to form and/or define a plurality of nodes. The nodes, in turn, may correspond to the types of coordinate systems described above with respect to FIGS. 2, 2a, 2b, and 3.

In operation, the touch sensor 200 (illustrated in FIGS. 2, 2a, 2b, and 3) provides a physical interface through which a user may provide input to touch sensor system 100. Each conductive element X1-X7/X10 and Y1-Y7/Y10 may have a natural resistance. Each conductive element X1-X7/X10 and Y1-Y7/Y10 may also have a natural capacitance to a ground (or virtual ground) plane within touch sensor 200. Thus, each conductive element X1-X7/X10 and Y1-Y7/Y10 may be used to form an RC circuit such as those depicted in FIG. 4. For example, circuit 412 of FIG. 4 may represent an RC circuit corresponding to an untouched, individual conductive element having a natural resistance depicted as resistor 413 and a natural capacitance Cp, which may include parasitic capacitances that are present within touch sensor 200. These natural resistances and capacitances may result from the particular material(s) with which the conductive elements are constructed, and the geometry of a specific conductive element. As such, the natural resistance and/or capacitances of a touch screen's conductive elements may be specifically chosen through design considerations.

When a user touches touch sensor 200 with a finger or other object, an additional capacitance may be added in parallel to the natural capacitance of the conductive element(s) near the location of touch. This second capacitance is illustrated as capacitance Cf in circuit 414 of FIG. 4. Again, resistor 415 of circuit 414 may correspond to the natural resistance of the conductive element, and capacitance Cp may correspond to the natural capacitance of the conductive element. Parallel capacitances Cp and Cf in circuit 414 may be added together to form a total sensor capacitance (Cs), as depicted in circuit 416. Thus, circuit 416 illustrates an RC circuit that may be formed in the presence of a touch.

As described more fully below, touch controller 400 of FIG. 1, via capacitance measurement circuit 500, may repeatedly measure the self capacitance Cs of each conductive element X1-X7/X10 and Y1-Y7/Y10 to determine if a user has touched touch sensor 200. In other words, by repeatedly measuring Cs, touch controller 400 may determine that a user has touched touch screen 200 when the value of Cs increases.

As used herein, the term "self capacitance" is used to represent the capacitive load, relative to ground (or virtual ground), that an electrode presents to a capacitive measuring system. In other words, each conductive element X1-X7/X10 and Y1-Y7/Y10 may be measured according to a self capacitance measurement, where the measurement of a particular conductive element is independent of any other conductive elements (disregarding any parasitic capacitances that may be present in touch controller 200). In other words, the self capacitance measurement for a particular conductive element may be performed independently from other conductive elements, but the capacitance value measured for a particular conductive element may at the same time be dependent on other conductive elements. Thus, in accordance with certain exemplary embodiments, self capacitance measurements may provide knowledge of which X and Y electrodes have a touch condition. As discussed above, however, a self capacitance measurement—on its own—may not be able to correlate multiple X and Y touched electrodes into (X,Y) coordinates (that is, when multiple simultaneous touch events have occurred).

Touch sensor 200 may also include a natural coupling capacitance at each X-Y intersection (node) on the touch sensor. As used herein, the term "mutual capacitance" is used to represent this coupling capacitance between electrodes on different layers at their point of intersection (that is, at a node on touch sensor 200). Thus, each node may be used to form an RC circuit such as those depicted in FIG. 5. For example, circuit 540 of FIG. 5 may represent an RC circuit corresponding to an untouched pair of X-Y conductive elements (for example, X1 and Y6 of FIG. 2). The conductive element on the X-layer may have a natural resistance depicted as resistor 542 and a natural capacitance Cpx, which may include parasitic capacitances that are present within touch sensor 200. Similarly, the conductive element on the Y-layer may have a natural resistance depicted as resistor 544 and a natural capacitance Cpy, which may include parasitic capacitances that are present within touch sensor 200. The natural coupling capacitance, or mutual capacitance, between the conductive element on the X-layer and the conductive element on the Y-layer is depicted as capacitance Cm.

When a user touches touch sensor 200 with a finger or other object, an additional capacitance may be added in parallel to the natural capacitance of the conductive element(s) near the location of touch. This additional capacitance is illustrated as capacitance Cf in circuit 546 of FIG. 5. Again, resistors 548 and 550 of circuit 546 may correspond to the natural resistance of each conductive element at a given node, and capacitances Cpx and Cpy may correspond to the natural capacitances of each conductive element at a given node. Thus, circuit 546 illustrates an RC circuit that may be formed in the presence of a touch.

As described more fully below, touch controller 400 of FIG. 1, via capacitance measurement circuit 500, may repeatedly measure the mutual capacitance Cm of each X-Y intersection node to determine if a user has touched touch sensor 200. In other words, by repeatedly measuring Cm, touch controller 400 may determine that a user has touched touch screen 200 when the value of Cm changes.

In exemplary embodiments, touch controller 400 may measure the capacitance of an individual conductive element or the capacitance between two conductive elements directly. According to alternative embodiments, touch controller 400 may measure the capacitance of an individual conductive element or the capacitance between two conductive elements indirectly, such as by measuring an effect that the capacitance may have on the RC circuit formed by the conductive element(s) or on a circuit coupled to such an RC circuit.

Figure 5:
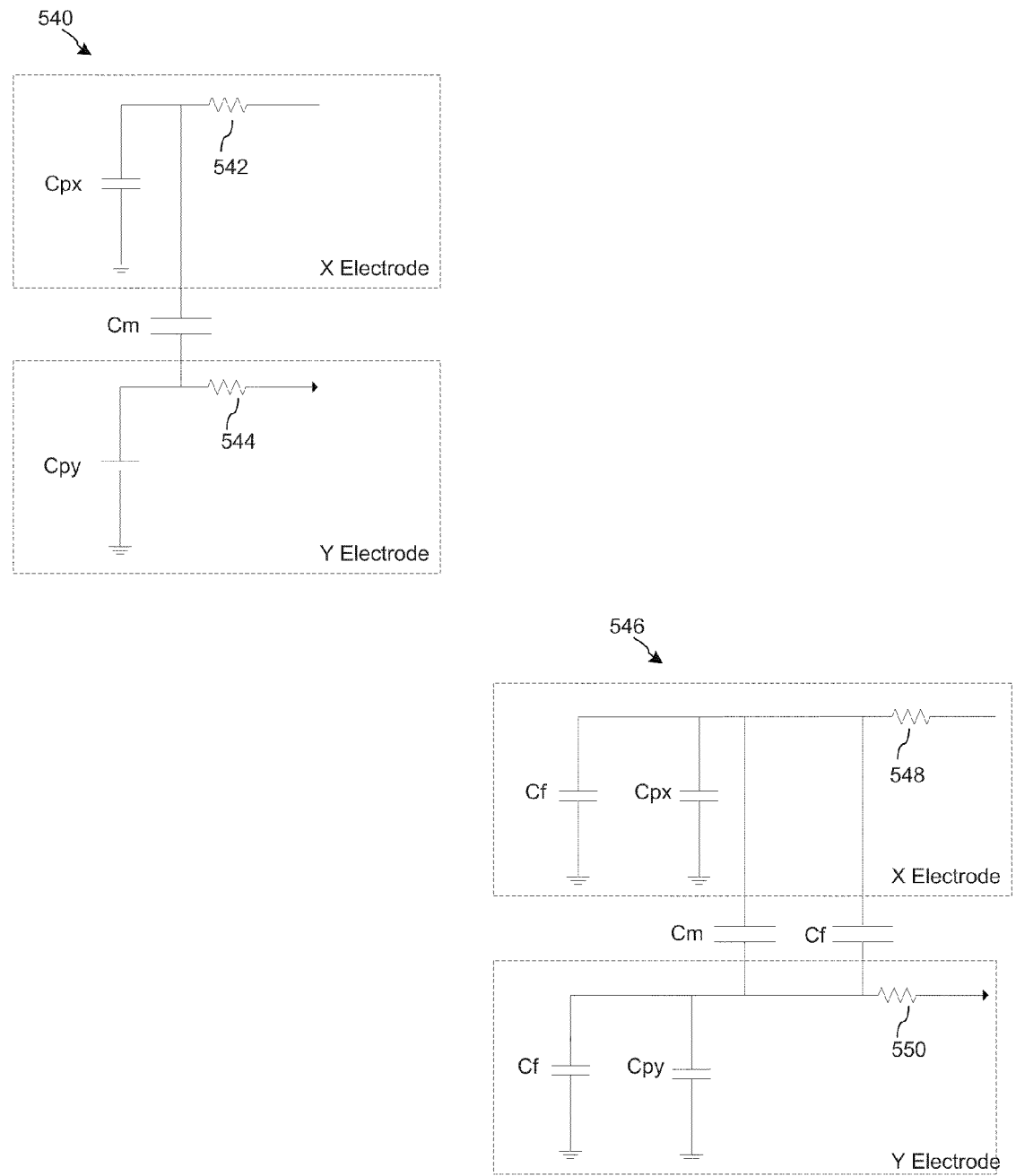
FIG. 5 illustrates electrical circuits corresponding to an example touch sensor in a touch sensor system, in accordance with the present disclosure.
Figure 6:
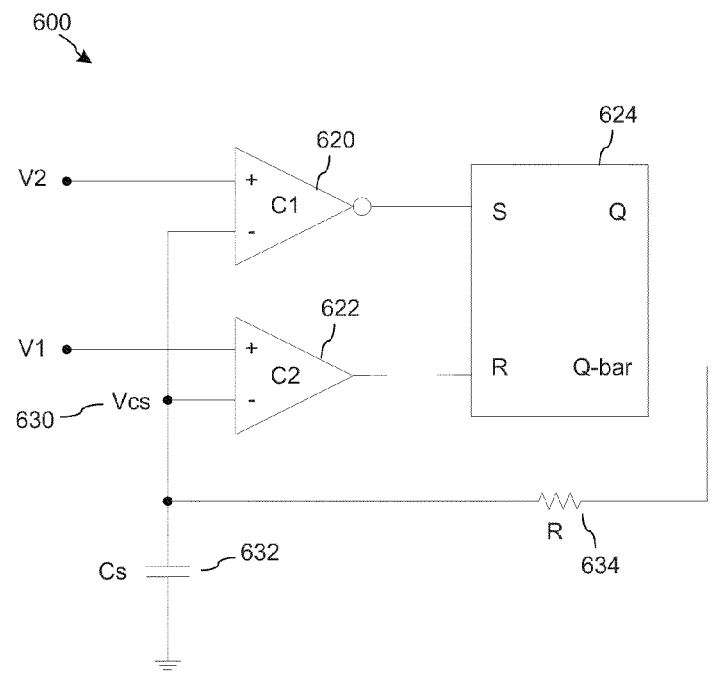
FIG. 6 illustrates an example relaxation oscillator circuit in a relaxation oscillator-based touch sensor system, in accordance with the present disclosure.

FIG. 6 illustrates an example relaxation oscillator circuit 600, such as one that may be used in capacitance measuring circuit 500 of FIG. 1, in accordance with certain exemplary embodiments of the present disclosure. According to this embodiment, capacitor 632 having a capacitance Cs and resistor 634 correspond to an RC circuit (for example, circuit 416 of FIG. 4) of an individual conductive element X1-X7 or Y1-Y7. In alternative embodiments, capacitance Cs may correspond to capacitance Cpy and resistor 634 may correspond to resistor 550 of circuit 546 (FIG. 5). Either of these RC circuits may be connected to comparators 620 and 622 and SR latch 624. As depicted, voltage Vcs at node 630 may correspond to the voltage across sensor capacitor 632. Voltage Vcs at node 630 may be used as the inverting input to both comparators 620 and 622. The non-inverting input of comparator 620 may be connected to voltage V2, and the non-inverting input of comparator 622 may be connected to voltage V1. In this embodiment, voltage V2 is greater than voltage V1.

The output of comparator 620 may be inverted and connected to the S input of SR latch 624. The output of comparator 622 may be connected to the R input of SR latch 624. The inverted output of SR latch 624 (i.e., Q-bar output) may be connected to the RC circuit formed by one of conductive elements X1-X7 or Y1-Y7.

In operation, relaxation oscillator circuit 600 may be used to create a window of operation in which the voltage Vcs at node 630 is cyclically charged to voltage level V2 and discharged to voltage level V1. Relaxation oscillator circuit 600 may achieve this function in the following manner. First, if the voltage at node 630 (i.e., the voltage across capacitor 632) drops below voltage V1, the output of comparator 622 will go HIGH. Similarly, if the voltage at node 630 rises above voltage V2, the output of comparator 620 will go HIGH (because of the inverted output). Next, comparator outputs may be connected to SR latch 624, which may behave according to the truth table in TABLE 1.

TABLE 1

| S | R | Q | Q-bar | Operation |
|---|---|---|---|---|
| 0 | 0 | HOLD (output holds last known value) | | |
| 0 | 1 | 0 | 1 | RESET |
| 1 | 0 | 1 | 0 | SET |
| 1 | 1 | 0 | 1 | RESET |

Thus, if the SET (S) input of SR latch 624 is driven HIGH, the Q-bar output of the latch may be driven LOW. If the RESET (R) input of latch 624 is driven HIGH, the Q-bar output of the latch may be driven HIGH. SR latch 624 may be a reset-dominant latch so that when both the S and R inputs are driven HIGH, SR latch 624 may be in RESET mode (i.e., Q-bar output may be driven HIGH). Finally, where both S and R inputs are driven LOW, the outputs of SR latch 624 may hold the last known output value.

Figure 7:
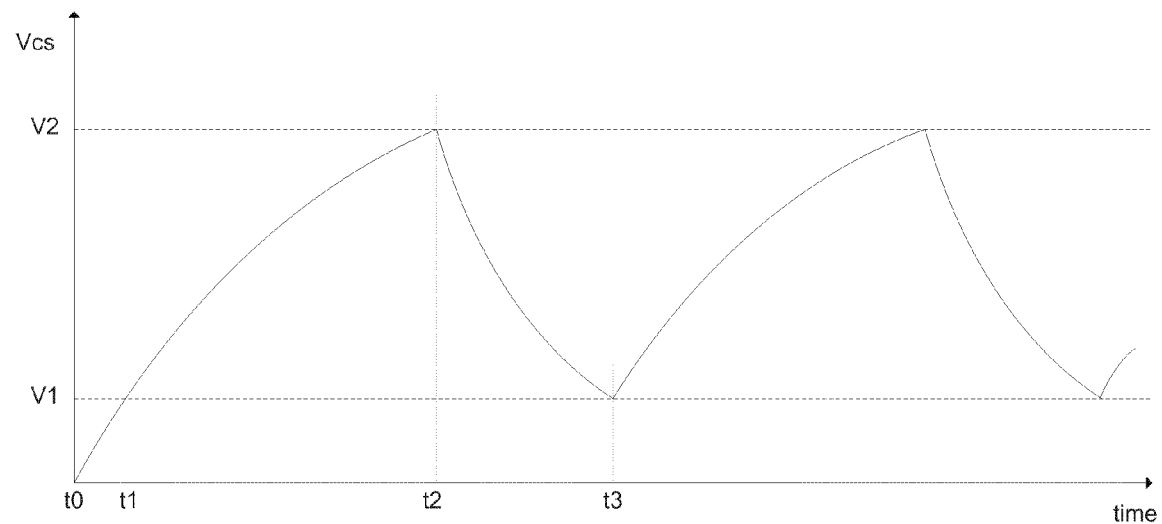
FIG. 7 illustrates an example timing diagram for a relaxation oscillator circuit output in a relaxation oscillator-based touch sensor system, in accordance with the present disclosure.

FIG. 7 illustrates an example timing diagram for a relaxation oscillator circuit 600 output in a relaxation oscillator-based touch sensor system 100, in accordance with certain embodiments of the present disclosure. FIG. 7, along with FIG. 6 and TABLE 1, further describes the function of relaxation oscillator circuit 600.

Starting with the very beginning of operation (i.e., device power-up), at time t0 in FIG. 7, the voltage Vcs across the sensor capacitor 632 (FIG. 6) may be 0. Therefore, comparator 622 output may be HIGH while the inverted output of comparator 620 may be LOW since both inverting inputs may be less than the non-inverting input voltages V2 and V1, respectively. This may place SR latch 624 into RESET, and may drive the Q-bar output to 1, which in turn may charge the sensor capacitor 632.

At time t1 depicted in FIG. 7, the voltage Vcs across sensor capacitor 632 may increase until it surpasses voltage threshold V1 present on the non-inverting input of comparator 622. This may cause the output of comparator 622 to go to 0. Thus, at time t1, both comparator outputs may be LOW and the SR latch 624 output may hold the last known value, which means that the Q-bar output may remain at 1 and may continue to charge sensor capacitor 632 (between time t1 and t2).

At time t2, the voltage Vcs across sensor capacitor 632 may exceed voltage threshold V2 present on the non-inverting input of comparator 620. This may cause the inverted output of comparator 620 to transition to 1. Thus, at time t2, the S input of SR latch 624 may be HIGH, and the R input of SR latch 624 may be LOW. This may cause the Q-bar output of SR latch 624 to transition to 0. At this time (t2), sensor capacitor 632 may begin to discharge (between time t2 and t3). When voltage Vcs drops below voltage threshold V2 (between time t2 and t3), the output of comparator 620 may again go LOW, and SR latch 624 may hold the last known value (that is, 0) and may allow capacitor 632 to continue to discharge.

At time t3, the voltage Vcs across sensor capacitor 632 may drop below voltage threshold V1. This may cause comparator 622 output to go to 1, driving the Q-bar output of SR latch 624 HIGH and again charging sensor capacitor 632. This charging and discharging process may repeat as long as there is power to the system.

The timing of the above-described function of relaxation oscillator circuit 600 may be affected by the electrical properties of the RC circuit formed by each conductive element X1-X7 and Y1-Y7 of touch sensor 200 (FIG. 2). For example, RC circuit 416 of FIG. 4 (corresponding to capacitor 632 and resistor 634 in FIG. 6), like all other RC circuits, may have an RC time constant corresponding to the amount of time necessary to charge capacitor Cs. The RC time constant may typically be represented by the Greek letter Tau, and may satisfy the following equation:

$$\tau = R * Cs$$

According to this equation, $\tau$ may represent the time it takes to charge capacitor Cs to about 63% of the supply voltage, and $5\tau$ may represent the time it takes to charge capacitor Cs to within 1% of the supply voltage. According to the equation, charging time may be directly proportional to capacitance Cs. As a result, the sensor capacitance Cs with no touch may charge and discharge more quickly than it does when a touch occurs. In other words, because a touch may increase the capacitance Cs of the RC circuit, the RC time constant may also be increased, and may result in longer charging and discharging periods. Longer charging and discharging periods, in turn, may result in a reduced frequency of relaxation oscillation circuit 500.

Figure 8:
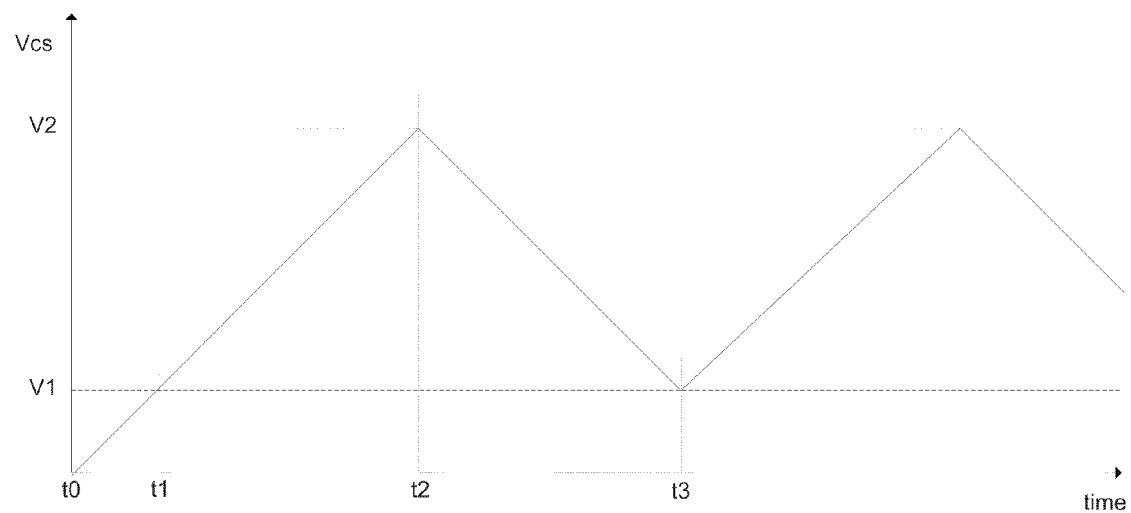
FIG. 8 illustrates an example timing diagram for a relaxation oscillator circuit output in a relaxation oscillator-based touch sensor system, in accordance with the present disclosure.

FIG. 8 illustrates an example timing diagram for a relaxation oscillator circuit 600 output in a relaxation oscillator-based touch sensor system 100, in accordance with alternative embodiments of the present disclosure. In this embodiment, the relaxation oscillator waveform may be triangular because it may be driven with a constant current source/sink. The behavior of relaxation oscillator circuit 600 is similar in this embodiment to that described above with respect to FIG. 7. FIG. 8, along with FIG. 6 and TABLE 1, further describes the function of relaxation oscillator circuit 600.

Given these properties of relaxation oscillator circuit 600, touch controller 400 may determine a touched condition by measuring the frequency of relaxation oscillator circuit 600. In certain exemplary embodiments, the above-described relaxation oscillator-based system may use the CSM module available on certain PIC microcontrollers manufactured by Microchip Technologies, Inc. According to alternative embodiments, a relaxation oscillator-based system may use discrete hardware components or components or integrated circuits provided by other semiconductor manufacturers.

Figure 9:
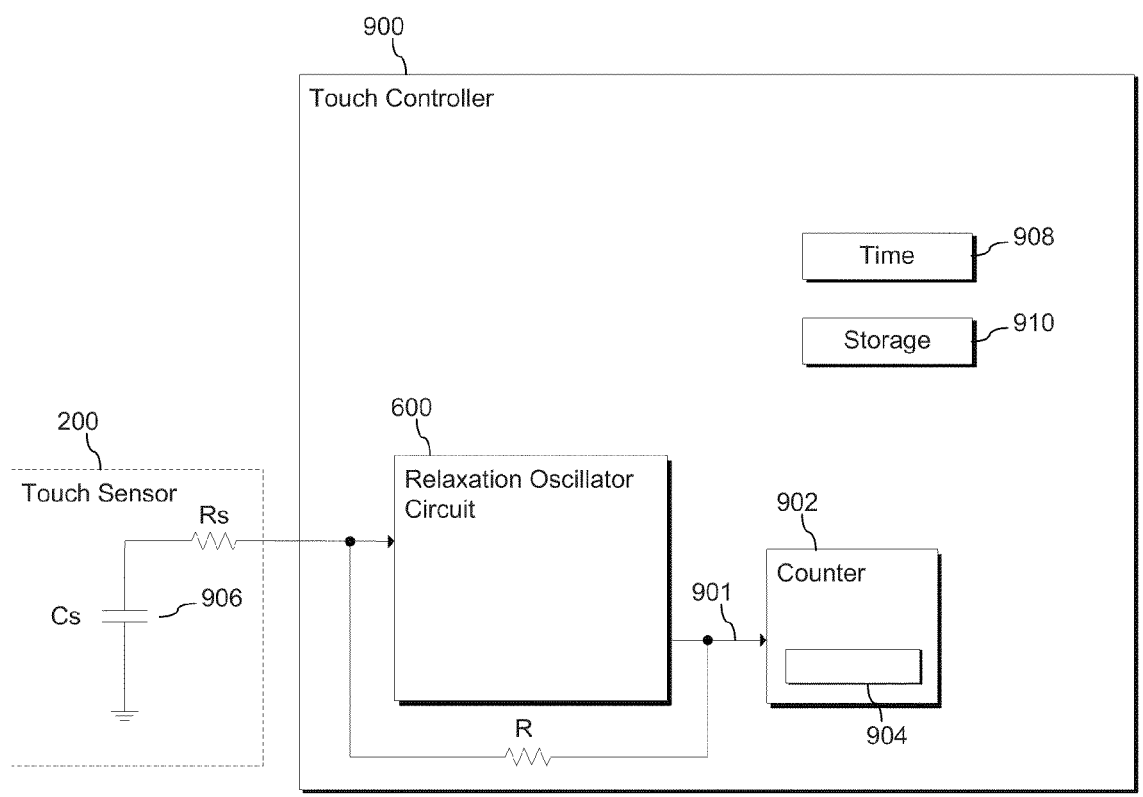
FIG. 9 illustrates an example touch controller in a relaxation oscillator-based touch sensor system, in accordance with the present disclosure.

FIG. 9 illustrates an example touch controller 900 (corresponding to touch controller 400 of FIG. 1) and provides further details regarding how the frequency of relaxation oscillator circuit 600 may be measured. For example, touch controller 900 may implement counter circuit 902 that is connected to output 901 of relaxation oscillator circuit 600 (i.e., the Q-bar output of SR latch 624 in FIG. 6). Counter circuit 902 may be operable to increment a value stored in counter register 904 on every positive or negative edge of the output 901.

According to one embodiment, which is referred to herein as a "frequency measurement method," touch controller 900 may read the counter register 904 at regular, pre-defined time intervals, for example, according to a pre-defined timer interrupt. Touch controller 900 may compare successive reads of counter register 904 to determine the number of times relaxation oscillator circuit 600 has oscillated during the pre-defined time interval. Accordingly, this number provides a measurement related to the frequency of relaxation oscillator circuit 600. Touch controller 900 may compare successive measurements to determine whether a touch event has occurred.

As described above, a touch may increase the capacitance Cs at capacitor 906, resulting in a reduced frequency of relaxation oscillator circuit 600. Thus, according to the frequency measurement method, if the value of counter register 904 decreases from one pre-defined time interval to the next, touch controller 900 may determine that a touch event has occurred. In some embodiments, touch controller 900 may not determine that a touch event has occurred unless the value of counter register 904 has decreased more than a pre-determined threshold. In such embodiments, touch controller 900 may be less prone to falsely reporting a touch event as a result of minor changes in the frequency of relaxation oscillator 600 due to conditions other than a touch event (e.g., noise, drift, etc.).

In another embodiment, which is referred to herein as a "period measurement method," touch controller 900 may count the time (or period) needed to fill up counter register 904. According to this period measurement embodiment, touch controller 900 may include a system time register 908. Touch controller 900 may reset the value of counter register 904 to ZERO and, at the same or substantially same time, may store the current value of system time register 908 into storage register 910. Here again, counter register 904 may increment on every positive or negative edge of output 901 of relaxation oscillator circuit 600. At some point, this may cause an overflow condition of counter register 904. Touch controller 900 may be configured to respond to an overflow condition of counter register 904 (e.g., via an interrupt) by reading the value of system time register 908 and comparing that value to the time value stored in storage register 910. This comparison provides the number of system time units needed to overflow the counter, and is an indication of the frequency of relaxation oscillator circuit 600.

As described above, a touch may increase the capacitance Cs at capacitor 906, resulting in a reduced frequency of relaxation oscillator circuit 600. Thus, according to the period measurement method, if the number of system time units needed to overflow counter register 904 increases between successive measurements, touch controller 900 may determine that a touch event has occurred. In some embodiments, touch controller 900 may not determine that a touch event has occurred unless the number of system time units taken to overflow counter register 904 has increased more than a predetermined threshold. In such embodiments, touch controller 900 may be less prone to falsely reporting a touch event as a result of minor changes in the frequency of relaxation oscillator circuit 600 due to conditions other than a touch event (e.g., noise, drift, etc.)

According to the frequency measurement method, the sampling window may be adjusted by modifying the length of the pre-defined timer interrupt. According to the period measurement method, the sampling window may be adjusted by changes in the maximum value of the counter register. For example, a small maximum value may result in a shorter sampling window and more frequent frequency measurements. The ratio between the speed of the scanning mechanism and the resolution of system 100 must always be considered when adjusting the sampling window.

While FIG. 9 depicts touch controller 900 and relaxation oscillator 600 effectively coupled to a single conductive element, or sensor electrode, of touch sensor 200, this illustration is merely exemplary. According to certain exemplary embodiments of system 100, each individual X and Y electrode may be individually addressable by touch controller 900 such that capacitance measuring circuit 500 of FIG. 1 (depicted as relaxation oscillator 600 in FIG. 9) may be coupled to each X and Y electrode individually, or to more than one electrode simultaneously. For example, touch controller may include an individual input for each electrode in touch sensor 200, and may implement multiplexing logic to individually address each input. Other methods of addressing the sensor electrodes may be implemented, and would be apparent—in light of the present disclosure—to one of ordinary skill in the art.

Figure 10:
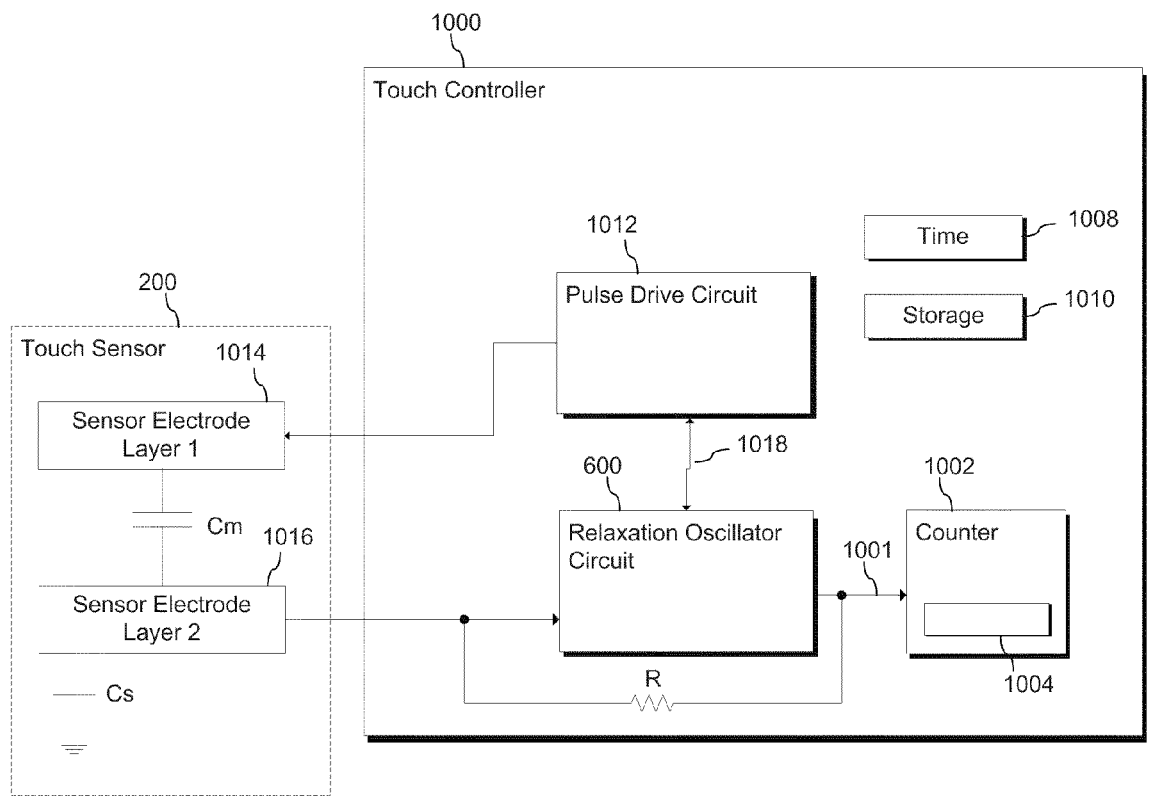
FIG. 10 illustrates an example touch controller in a relaxation oscillator-based touch sensor system, in accordance with the present disclosure.

FIG. 10 illustrates an example touch controller 1000 (corresponding to touch controller 400 of FIG. 1) and provides further details regarding the operation of relaxation oscillator circuit 600 while measuring a mutual capacitance between sensor electrode 1014 on a first layer and sensor electrode 1016 on a second layer of touch sensor 200. As depicted in FIG. 10, counter circuit 1002, output 1001, counter register 1004, system time register 1008, and storage register 1010 may generally correspond to and have similar functionality as like-numbered elements 902, 901, 904, 908, and 910, respectively, which are described above with respect to FIG. 9.

According to certain exemplary embodiments, touch controller 1000 may include pulse drive circuit 1012, which may be coupled to one or both layers of sensor electrodes in touch sensor 200. As illustrated, pulse drive circuit 1012 may be coupled to sensor electrode 1014 on a first layer of touch sensor 200. (Here again, each individual X and Y electrode may be individually addressable by touch controller 1000 such that relaxation oscillator 600 and pulse drive circuit 1012 may be coupled to each X and Y electrode individually, or to more than one electrode simultaneously.) Pulse drive circuit 1012 may also be coupled to relaxation oscillator circuit 600, which, in turn, may be coupled to sensor electrode 1016 on a second layer of touch sensor 200.

Pulse drive circuit 1012 may be configured to drive an electrical signal onto sensor electrode 1014 while relaxation oscillator circuit 600 is used to measure the capacitance of sensor electrode 1016. According to this embodiment, sensor electrode 1014 on a first layer of touch sensor 200 may serve as a transmitter electrode, and sensor electrode 1016 on a second layer of touch sensor 200 may serve as a receiver electrode. Accordingly, a capacitance may be measured on receiver electrode 1016, while an electrical signal may be driven on transmitter electrode 1014. The driven signal on the transmitter electrode 1014 may alter the capacitive measurement taken on the receiver electrode 1016 because some of the transmitter signal may be coupled through the mutual capacitance Cm. A touch in proximity to the transmitter/receiver intersection (node) on touch sensor 200 may provide a capacitively coupled ground path (not shown) that may shunt away some of the transmitter coupled signal current (that is, as embodied in the electrical signal provided by pulse drive circuit 1012). As a result, the signal coupled through the mutual capacitance Cm may be measurably altered and may indicate a touched condition at the measured node.

Figure 11:
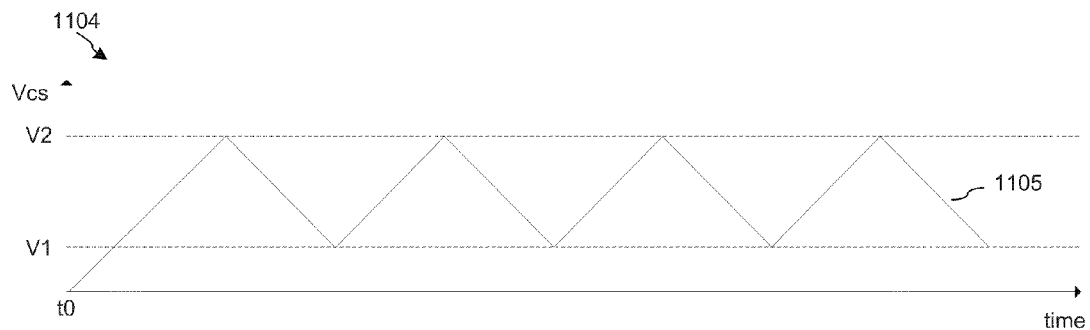
FIG. 11 illustrates example timing diagrams for a relaxation oscillator circuit output and a pulse drive circuit output in a relaxation oscillator-based touch sensor system, in accordance with the present disclosure.
Figure 11:
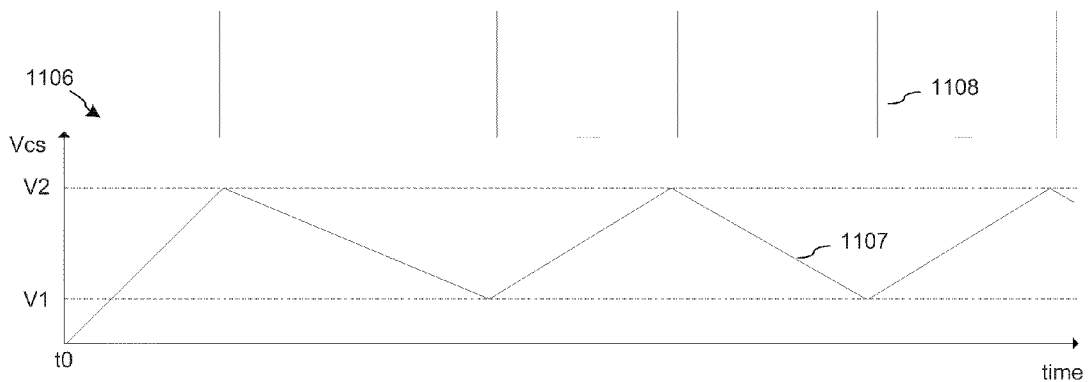
Figure 11:
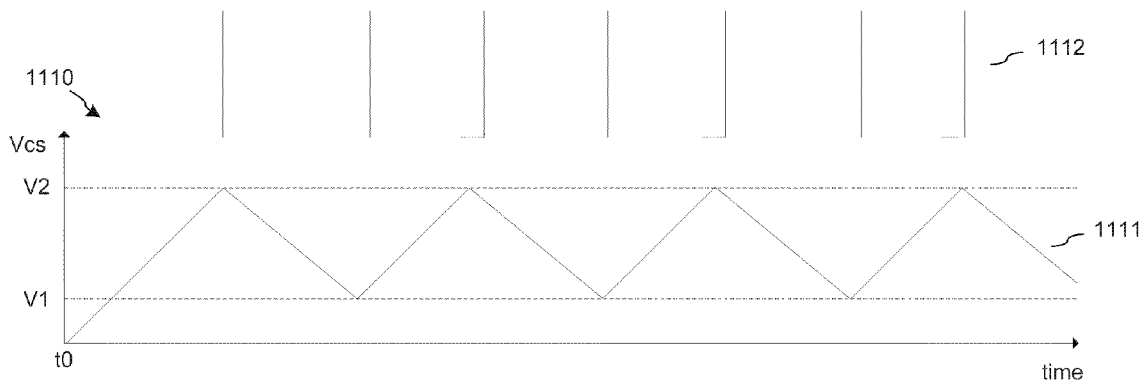

FIG. 11 illustrates various example timing diagrams for relaxation oscillator circuit 600 output and pulse drive circuit 1012 output in a relaxation oscillator-based touch sensor system 100, in accordance with certain embodiments of the present disclosure. For example, timing diagram 1104 shows relaxation oscillator output waveform 1105, which is similar to the relaxation oscillator output waveform depicted in FIGS. 7-8. Timing diagram 1104 may correspond to a self capacitance measurement of a conductive element of touch sensor 200. Alternatively, timing diagram 1104 may correspond to a mutual capacitance measurement (for example, between sensor electrodes 1014 and 1016 of FIG. 10) where pulse drive circuit output is not being driven.

Timing diagram 1106 shows relaxation oscillator output waveform 1107, according to various exemplary embodiments of the present disclosure. Also depicted in timing diagram 1106 is pulse drive circuit output 1108. As depicted, pulse drive circuit output 1108 may drive an electrical signal onto a transmitter electrode during a mutual capacitance measurement. According to one embodiment, the rising edge of the pulse drive circuit output waveform 1108 may be synchronized with the beginning of the discharging state (that is, the falling edge) of relaxation oscillator output waveform 1107. For example, the relaxation oscillator circuit 600 may raise a flag on state transitions (for example, when transitioning from a charging state to a discharging state), and pulse drive circuit 1012 may recognize that this flag has been raised. In some embodiments, this flag signal may be communicated between relaxation oscillator circuit 600 and pulse drive circuit 1012 on signal 1018 (FIG. 10). According to alternative embodiments, pulse drive circuit 1012 and relaxation oscillator circuit 600 may comprise a single, unified circuit, such as capacitance measuring circuit 500 (FIG. 1).

Continuing with timing diagram 1106, the rising edge of the pulse drive circuit output waveform 1108u may be synchronized with the beginning of the discharging state of relaxation oscillator output waveform 1107. As depicted, this may inject current into the receiver electrode's capacitive load, which may slow down the relaxation oscillator waveform 1107 frequency. For example, while the waveforms in FIG. 11 are not to scale and are illustrative only, relaxation oscillator output 1107 has a slower frequency than relaxation oscillator output 1105 of timing diagram 1104 (which may represent the system without the pulse drive output).

Timing diagram 1110 shows relaxation oscillator output waveform 1111 and pulse drive output waveform 1112, according to various exemplary embodiments of the present disclosure. Timing diagram 1110 is similar to timing diagram 1106, but may illustrate the effect of a finger touch near the intersection of the receiver and transmitter sensor electrodes. In certain embodiments, a finger touch near the intersection of the receiver and transmitter sensor electrodes may provide a capacitively coupled shunting path for some of the current injected into the transmitter sensor electrode by the pulse drive circuit output 1112. As illustrated, the touch induced shunting path may steal some of the pulse injected current, which may cause an increase in the frequency of relaxation oscillator output waveform (1111). For example, relaxation oscillator output 1111 has a faster frequency than relaxation oscillator output 1107 of timing diagram 1106 (which may represent the system with an active pulse drive output but without a touch condition).

Figure 11A:
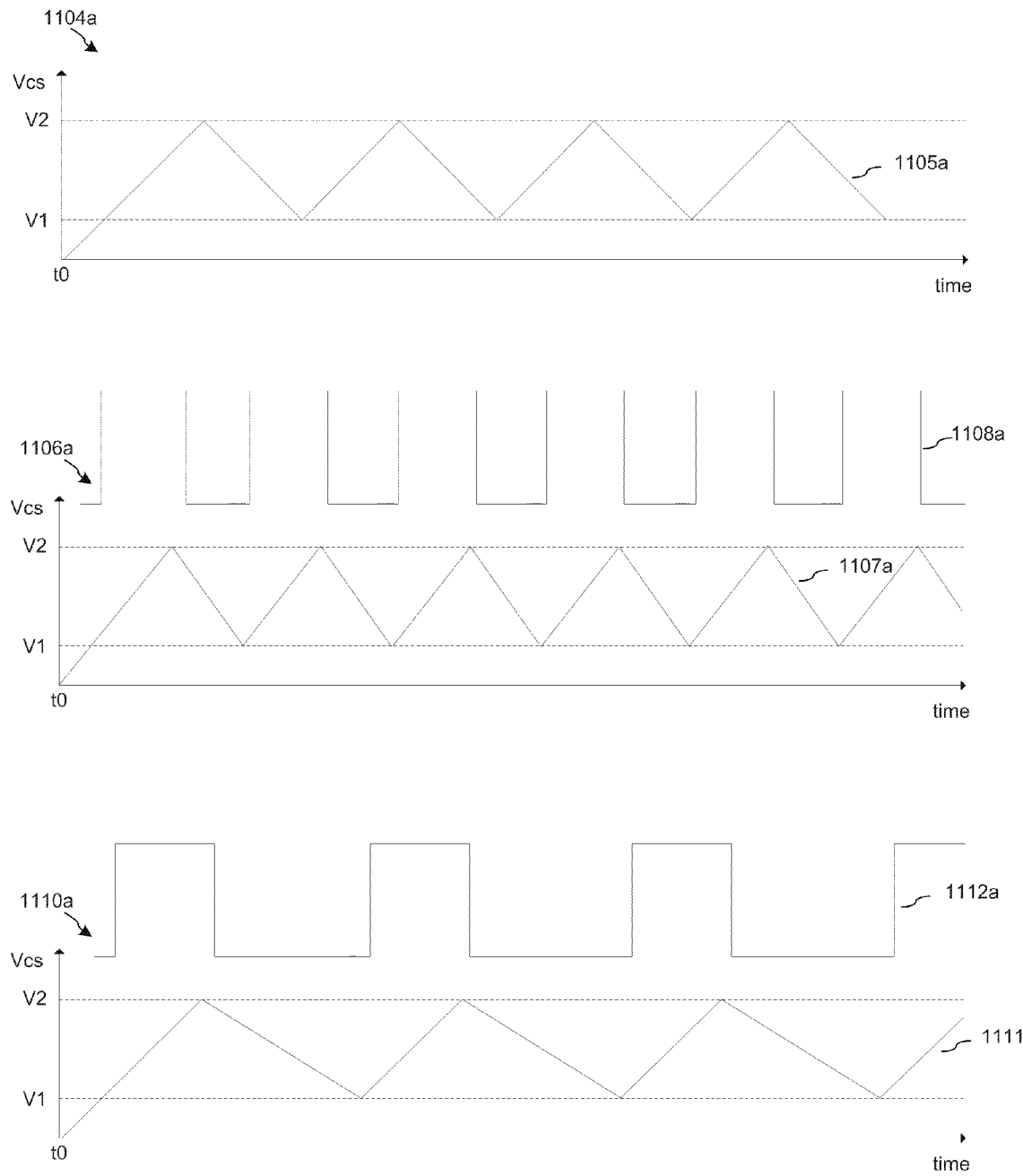
FIG. 11a illustrates example timing diagrams for a relaxation oscillator circuit output and a pulse drive circuit output in a relaxation oscillator-based touch sensor system, in accordance with the present disclosure.

FIG. 11a illustrates various example timing diagrams for relaxation oscillator circuit 600 output and pulse drive circuit 1012 output in a relaxation oscillator-based touch sensor system 100, in accordance with certain embodiments of the present disclosure. For example, timing diagram 1104a shows relaxation oscillator output waveform 1105a, which is similar to the relaxation oscillator output waveform depicted in FIGS. 7-8. Timing diagram 1104a may correspond to a self capacitance measurement of a conductive element of touch sensor 200. Alternatively, timing diagram 1104a may correspond to a mutual capacitance measurement (for example, between sensor electrodes 1014 and 1016 of FIG. 10) where pulse drive circuit output is not being driven.

Timing diagram 1106a shows relaxation oscillator output waveform 1107a, according to various exemplary embodiments of the present disclosure. Also depicted in timing diagram 1106a is pulse drive circuit output 1108a. As depicted, pulse drive circuit output 1108a may drive an electrical signal onto a transmitter electrode during a mutual capacitance measurement. According to one embodiment, the rising edge of the pulse drive circuit output waveform 1108a may be synchronized with the beginning of the charging state (that is, the rising edge) of relaxation oscillator output waveform 1107a. For example, the relaxation oscillator circuit 600 may raise a flag on state transitions (for example, when transitioning from a discharging state to a charging state), and pulse drive circuit 1012 may recognize that this flag has been raised. In some embodiments, this flag signal may be communicated between relaxation oscillator circuit 600 and pulse drive circuit 1012 on signal 1018 (FIG. 10). According to alternative embodiments, pulse drive circuit 1012 and relaxation oscillator circuit 600 may comprise a single, unified circuit, such as capacitance measuring circuit 500 (FIG. 1).

As depicted in timing diagram 1106a, the transmitter pulse edges may not occur exactly at the relaxation oscillator transitions. (This may be the case for other embodiments, such as depicted in FIG. 11.) This timing offset may be due to design-inherent time delay between sensing the transition of the relaxation oscillator output and driving the transmitter. However, this timing offset should not be read as a limitation of the design, and other embodiments may achieve better synchronization that that depicted. In addition, the exact location of the synchronized transmitter pulse edges (with respect to the oscillator transitions) may wander a bit. Preferably, however, the transmitter pulse edge will remain in the appropriate slope of the relaxation oscillator output, and will occur early enough in the appropriate slope of the relaxation oscillator output so that the effect of the transmitter pulse is realized.

Continuing with timing diagram 1106a, the rising edge of the pulse drive circuit output waveform 1108a may be synchronized with the beginning of the charging state of relaxation oscillator output waveform 1107a. As depicted, this may inject current into the receiver electrode's capacitive load, which may speed up the relaxation oscillator waveform 1107a frequency. Similarly, the falling edge of the pulse drive circuit output waveform 1108a may be synchronized with the beginning of the discharging state of relaxation oscillator output waveform 1107a. As depicted, this may withdraw current from the receiver electrode's capacitive load, which may speed up the relaxation oscillator waveform 1107a frequency. For example, while the waveforms in FIG. 11a are not to scale and are illustrative only, relaxation oscillator output 1107a has a faster frequency than relaxation oscillator output 1105a of timing diagram 1104a (which may represent the system without the pulse drive output).

Timing diagram 1110a shows relaxation oscillator output waveform 1111a and pulse drive output waveform 1112a, according to various exemplary embodiments of the present disclosure. Timing diagram 1110a is similar to timing diagram 1106a, but may illustrate the effect of a finger touch near the intersection of the receiver and transmitter sensor electrodes. In certain embodiments, a finger touch near the intersection of the receiver and transmitter sensor electrodes may provide a capacitively coupled shunting path for some of the current injected into the transmitter sensor electrode by the pulse drive circuit output 1112a. As illustrated, the touch induced shunting path may steal some of the pulse injected current, which may cause an decrease in the frequency of relaxation oscillator output waveform (1111a). For example, relaxation oscillator output 1111a has a slower frequency than relaxation oscillator output 1107a of timing diagram 1106a (which may represent the system with an active pulse drive output but without a touch condition).

Figure 11B:
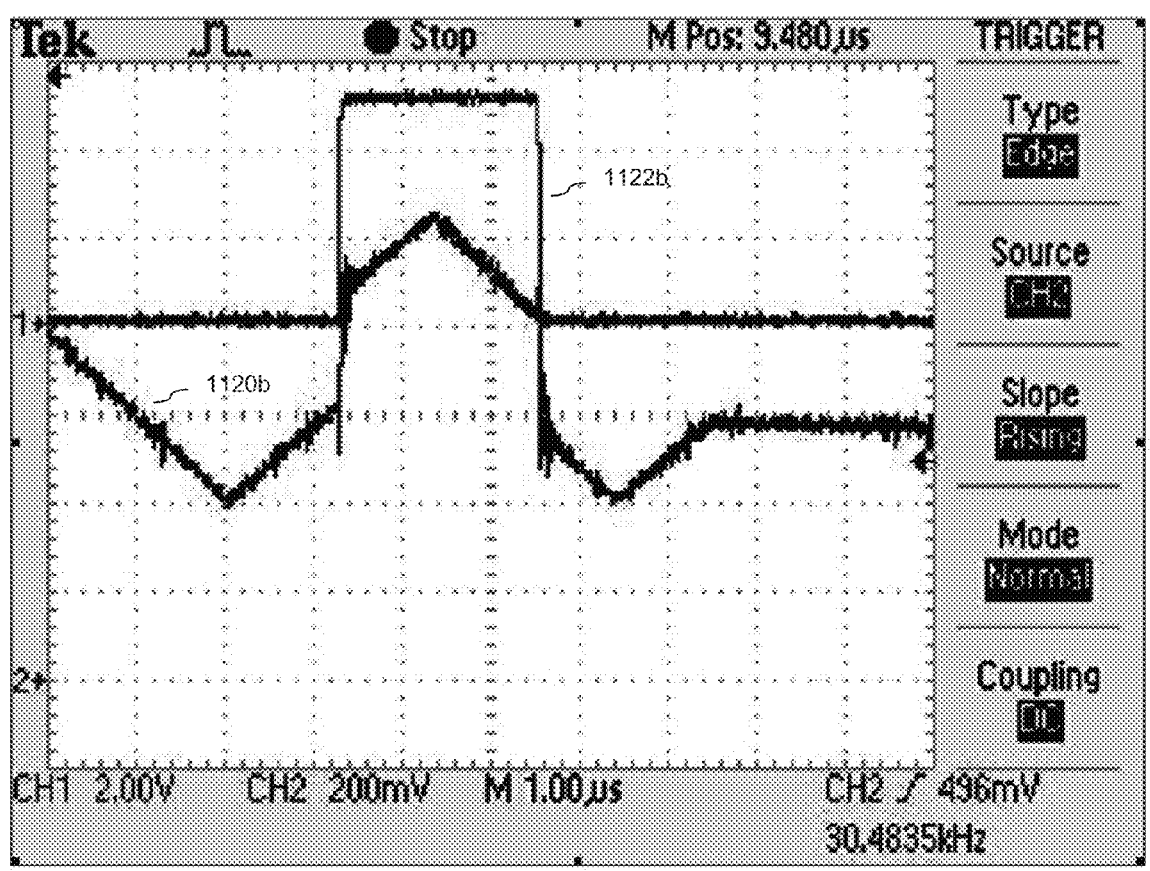
FIG. 11b illustrates an example timing diagram for a relaxation oscillator circuit output and a pulse drive circuit output in a relaxation oscillator-based touch sensor system, in accordance with the present disclosure.

FIG. 11b illustrates an example timing diagram for relaxation oscillator circuit 600 output and pulse drive circuit 1012 output in a relaxation oscillator-based touch sensor system 100, in accordance with certain embodiments of the present disclosure. The timing diagram in FIG. 11b shows relaxation oscillator output waveform 1120b, according to various exemplary embodiments of the present disclosure. Also depicted is pulse drive circuit output 1122b. The timing diagrams depicted in FIGS. 11 and 11a are illustrative of the effects that pulse drive circuit 1012 may have on the relaxation oscillator output. As depicted therein, the pulse may simply change the slope of the relaxation oscillator output waveform. While this may be the case in certain embodiments, FIG. 11b illustrates that, in other embodiments, the injected pulse may produce level step changes in the respective relaxation oscillator's charging and discharging slopes. One of ordinary skill in the art that this level step change may have a similar effect on relaxation oscillator circuit 600 as the slope changes depicted in FIGS. 11 and 11a (i.e., an increase or decrease in oscillator frequency, depending on the phase synchronization).

Thus, according to certain exemplary embodiments of the present disclosure, multiple simultaneous touches in a multi-touch sensor system may be recognized. For example, as discussed above with respect to FIGS. 1-11, the frequency of relaxation oscillator circuit 600 may be measured according to a frequency measurement method and/or a period measurement method, for example when pulse drive circuit 1012 is active. In this manner, touch controller 400/900/1000 may iterate over each node in touch sensor 200 to determine whether one or more nodes have been touched. For example, touch controller 400/900/1000 may step through each conductive element X1-X7 on a first layer of touch sensor 200, setting each as a receiver electrode and measuring the mutual capacitance of each node by selecting each conductive element Y1-Y7 on the other layer as a transmitter electrode and measuring the mutual capacitance.

Figure 12:
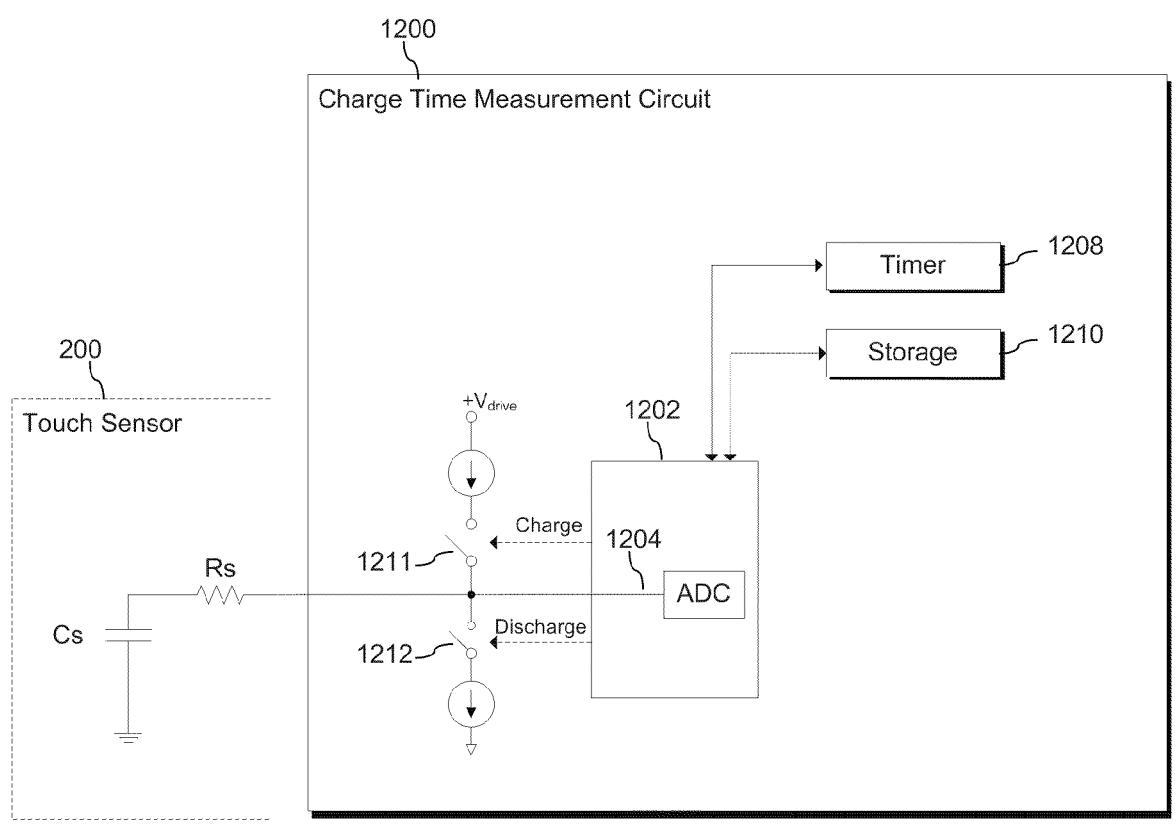
FIG. 12 illustrates an example charge time measurement circuit in a charge time-to-voltage-based touch sensor system, in accordance with the present disclosure.

FIG. 12 illustrates an example charge time measurement circuit 1200, such as one that may be used in capacitance measuring circuit 500 of FIG. 1, in accordance with certain exemplary embodiments of the present disclosure. According to this embodiment, capacitor Cs and resistor Rs correspond to an RC circuit (for example, circuit 416 of FIG. 4) of an individual conductive element X1-X7 or Y1-Y7 (FIG. 2). In alternative embodiments, capacitance Cs may correspond to capacitance Cpy and resistor Rs may correspond to resistor 550 of circuit 546 (FIG. 5). Either of these RC circuits may be connected to charge time measurement circuit 1200.

According to certain exemplary embodiments, charge time measurement circuit 1200 may comprise control unit 1202, which may include analog to digital converter ADC, which may convert a voltage level on signal 1204 into a digital value. Control unit 1202 may also comprise circuitry to control the charging and discharging of signal 1204, for example, by synchronizing the connection/disconnection of charging gate 1211 and discharging gate 1212. Accordingly, control unit 1202 may enter a charging state by causing charge gate 1211 to close while keeping discharging gate 1212 open. Conversely, control unit 1202 may enter a discharging state by causing charge gate 1211 to open while closing discharging gate 1212. In this manner, control unit 1202 of charge time measurement circuit 1200 may connect a charging voltage or current source to an individual sensor electrode of touch sensor 200. Similarly, control unit 1202 of charge time measurement circuit 1200 may connect a discharging voltage or current sink to an individual sensor electrode of touch sensor 200. In alternative embodiments, one or both of the current source and current sink depicted in FIG. 12 may be omitted (e.g., charging gate 1211 connected directly to voltage $V_{drive}$, discharging gate 1212 connected directly to ground (or virtual ground), etc.).

Charge time measurement circuit 1200 may also comprise timer 1208 and storage 1210. According to certain embodiments of the present disclosure, timer 1208 may function as a count-down timer such that it may signal to control unit 1202 when a predetermined time delay has elapsed. In alternative embodiments, timer 1208 may function as a timer, starting at time ZERO and incrementing according to a specified period of time (ms, us, ps, etc.). According to this alternative embodiment, control unit 1202 may use timer 1208 to determine how long it takes to charge signal 1204 to a predetermined voltage level. According to certain embodiments, storage 1210 may be used to store any of the previously-discussed predetermined values (for example, a predetermined voltage level, a predetermined time delay, etc.).

In accordance with the exemplary embodiment depicted in FIG. 12, system 100 may measure the capacitance of an individual sensor electrode of touch sensor 200 by measuring the charge time-to-voltage relationship for the capacitive load presented by the sensor electrode. Such a measurement may use the following electrical relationship:

$$i = Cdv/dt = C\Delta V/\Delta t$$

OR

Current=Capacitance*(Change in Voltage/Change in Time)

Thus, the voltage at a defined charge time is dependent on a capacitance of a connected sensing electrode. Thus, a voltage at a defined charge time may change when a touch is introduced near the sensing electrode because the touch may change the total capacitance presented by the electrode. Accordingly, a change in charge voltage may be an indication of a touch condition.

Given these properties of charge time measurement circuit 1200, touch controller 400 may determine a touched condition by measuring the charge time-to-voltage of a given sensor electrode. According to one embodiment, touch controller 400 may measure the charge time-to-voltage using the "VACST method" (Voltage After Charging for a Set Time). In the VACST method, control unit 1202 may connect a charging voltage or current to a sensor electrode to be measured, for example, by controlling charging gate 1211 and discharging gate 1212, as described above. At the same time (or nearly the same time), control unit 1202 may start timer 1208 in the count-down mode and wait for timer 1208 to signal when a predetermined time delay has elapsed. Control unit 1202 may then measure the charge voltage (for example, using ADC) of the sensor element (that is, signal 1204, which is connected to the sensor element of touch sensor 200).

According to an alternative embodiment, touch controller 400 may measure the charge time-to-voltage using the "TCSV method" (Time to Charge to Set Voltage). In the TCSV method, control unit 1202 may connect a charging voltage or current to a sensor electrode to be measured, for example, by controlling charging gate 1211 and discharging gate 1212, as described above. At the same time (or nearly the same time), control unit 1202 may start timer 1208 in timer mode (that is, starting at ZERO and counting up). Control unit 1202 may repeatedly measure the charge voltage (for example, using ADC) of the sensor element (that is, signal 1204) until the charge voltage has reached a predetermined level. Thereafter, control unit 1202 may stop and/or read the value of timer 1208, which value may represent the time required to charge the capacitive load presented by the sensor element to the predetermined voltage level.

According to certain exemplary embodiments, the above-described charge time-to-voltage-based system may use the CTMU module available on certain PIC microcontrollers manufactured by Microchip Technologies, Inc. According to alternative embodiments, a charge time-to-voltage-based system may use discrete hardware components or components or integrated circuits provided by other semiconductor manufacturers.

Figure 13:
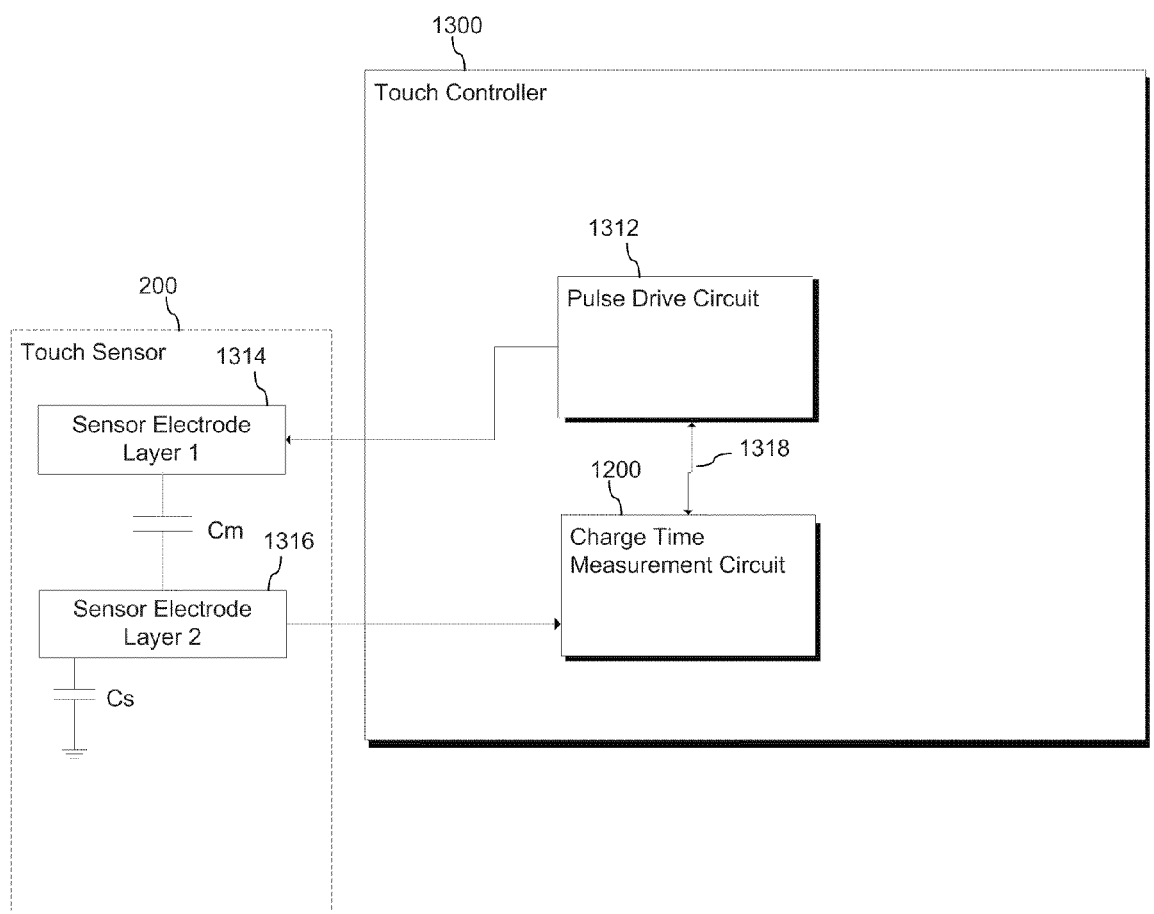
FIG. 13 illustrates an example touch controller in a charge time-to-voltage-based touch sensor system, in accordance with the present disclosure.

FIG. 13 illustrates an example touch controller 1300 (corresponding to touch controller 400 of FIG. 1) and provides further details regarding the operation of charge time measurement circuit 1200 while measuring a mutual capacitance between sensor electrode 1314 on a first layer and sensor electrode 1316 on a second layer of touch sensor 200.

According to certain exemplary embodiments, touch controller 1300 may include pulse drive circuit 1312, which may be coupled to one or both layers of sensor electrodes in touch sensor 200. As illustrated, pulse drive circuit 1312 may be coupled to sensor electrode 1314 on a first layer of touch sensor 200. (Here again, each individual X and Y electrode may be individually addressable by touch controller 1300 such that charge time measurement circuit 1200 and pulse drive circuit 1312 may be coupled to each X and Y electrode individually, or to more than one electrode simultaneously.) Pulse drive circuit 1312 may also be coupled to charge time measurement circuit 1200, which, in turn, may be coupled to sensor electrode 1316 on a second layer of touch sensor 200.

Pulse drive circuit 1312 may be configured to drive an electrical signal onto sensor electrode 1314 while charge time measurement circuit 1200 is used to measure the capacitance of sensor electrode 1316. According to some embodiments, pulse drive circuit 1312 may drive a periodic pulse signal, such as those pulse signals 1108 and 1112 in FIG. 11. In alternative embodiments, the shape of the pulse drive circuit output waveform may be altered.

In the exemplary touch controller 1300 embodiment of FIG. 13, sensor electrode 1314 on a first layer of touch sensor 200 may serve as a transmitter electrode, and sensor electrode 1316 on a second layer of touch sensor 200 may serve as a receiver electrode. Accordingly, a capacitance may be measured on receiver electrode 1316, while an electrical signal may be driven on transmitter electrode 1314. The driven signal on the transmitter electrode 1314 may alter the capacitive measurement taken on the receiver electrode 1316 because some of the transmitter signal may be coupled through the mutual capacitance Cm. More specifically, the signal driven on the transmitter electrode may inject or withdraw current into the receiver electrode's capacitive load, which may increase or decrease the charge voltage of the receiver electrode and/or speed up or slow down the time it takes the receiver electrode to charge to the predetermined voltage level mentioned above. A touch in proximity to the transmitter/receiver intersection (node) on touch sensor 200 may provide a capacitively coupled ground path (not shown) that may shunt away some of the transmitter coupled signal current (that is, as embodied in the electrical signal provided by pulse drive circuit 1312). As a result, the signal coupled through the mutual capacitance Cm may be measurably altered and may indicate a touched condition at the measured node.

For example, when employing the VACST method for measuring the charge time-to-voltage in touch controller 1300, the addition of the pulse drive circuit 1312 of FIG. 13 may increase the measured charge voltage compared to when the pulse drive circuit is not employed. The presence of a touch condition, on the other hand, may steal some of the pulse injected current, which may cause a decrease in the charge voltage during the predetermined period of time.

When employing the TCSV method for measuring the charge time-to-voltage in touch controller 1300, the addition of the pulse drive circuit 1312 of FIG. 13 may decrease the amount of time it takes to charge the sensor electrode to the predetermined voltage level compared to when the pulse drive circuit is not employed. The presence of a touch condition, on the other hand, may steal some of the pulse injected current, which may cause an increase in the time it takes to charge the sensor electrode to the predetermined voltage level.

Figure 17:
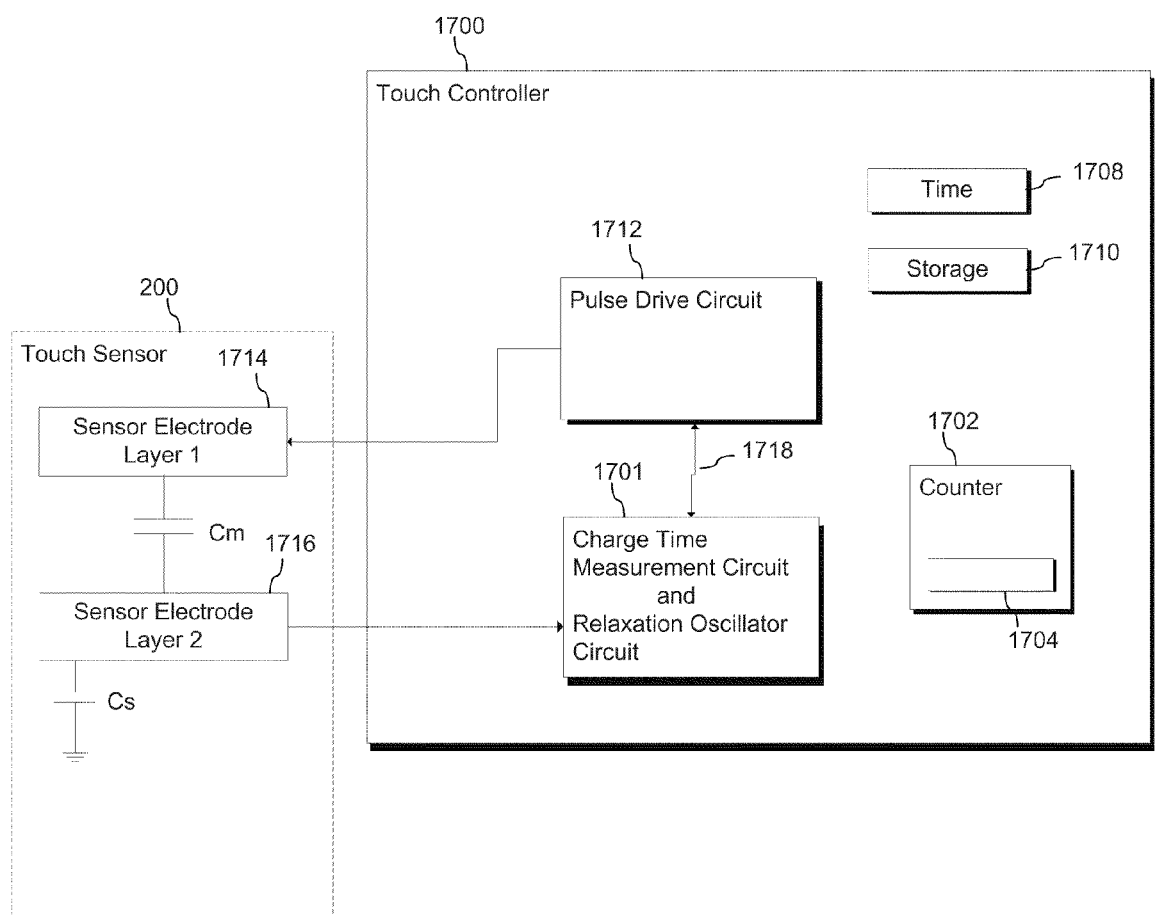
FIG. 17 illustrates an example touch controller in a combined relaxation oscillator-based and charge time-to-voltage-based touch sensor system, in accordance with the present disclosure.

As discussed above with respect to FIGS. 1-11, the frequency of relaxation oscillator circuit 600 may be disturbed when a user touches touch screen 200 with a finger or other object. Additionally, with respect to FIGS. 12-13, the charge time of charge time measurement circuit 1200 may be disturbed when a user touches touch screen 200 with a finger or other object. Depending on environmental and other design factors, it may be more advantageous to use a relaxation oscillator-based system. In other contexts, it may be more advantageous to use a charge time-to-voltage-based system. FIG. 17 illustrates an example touch controller utilizing a combined relaxation oscillator-based and charge time-to-voltage-based touch sensor system, in accordance with the present disclosure.

As depicted in FIG. 17, touch controller 1700 (which may correspond to touch controller 400 of FIG. 1) may include features similar to those described with respect to FIGS. 10 and 13. Touch controller 1700 may differ from those embodiments by including block 1701, which may combine the charge time measurement circuit and the relaxation oscillator circuit. In this manner, touch controller 1700 may choose an appropriate method for measuring the mutual capacitance between sensor electrodes 1714 and 1716. For example, according to certain exemplary embodiments, charge time measurement circuit and relaxation oscillator circuit may be selectable based on a software-alterable setting. In some exemplary embodiments, the operation of charge time measurement circuit and relaxation oscillator circuit may be mutually exclusive such that only one may be in operation at any given time. In an alternative embodiment, both circuits may be operational. For example, touch controller 1700 may measure each node in touch sensor 200 utilizing the relaxation oscillator circuit (and related methods described herein), and then measure each node in touch sensor 200 utilizing the charge time measurement circuit (and related methods described herein). In alternative embodiments, touch controller 1700 may measure one node utilizing the relaxation oscillator circuit, followed with a measurement utilizing the charge time measurement circuit, and switch back and forth until all nodes have been measured. In the embodiment where both circuits are operational, touch controller 1700 may report a touch if either circuit indicates a touched condition. Alternatively, touch controller 1700 may only report a touch if both circuits indicate a touched condition. In this manner, touch controller 1700 may provide operation that is less affected by environmental and other design factors.

Figure 14:
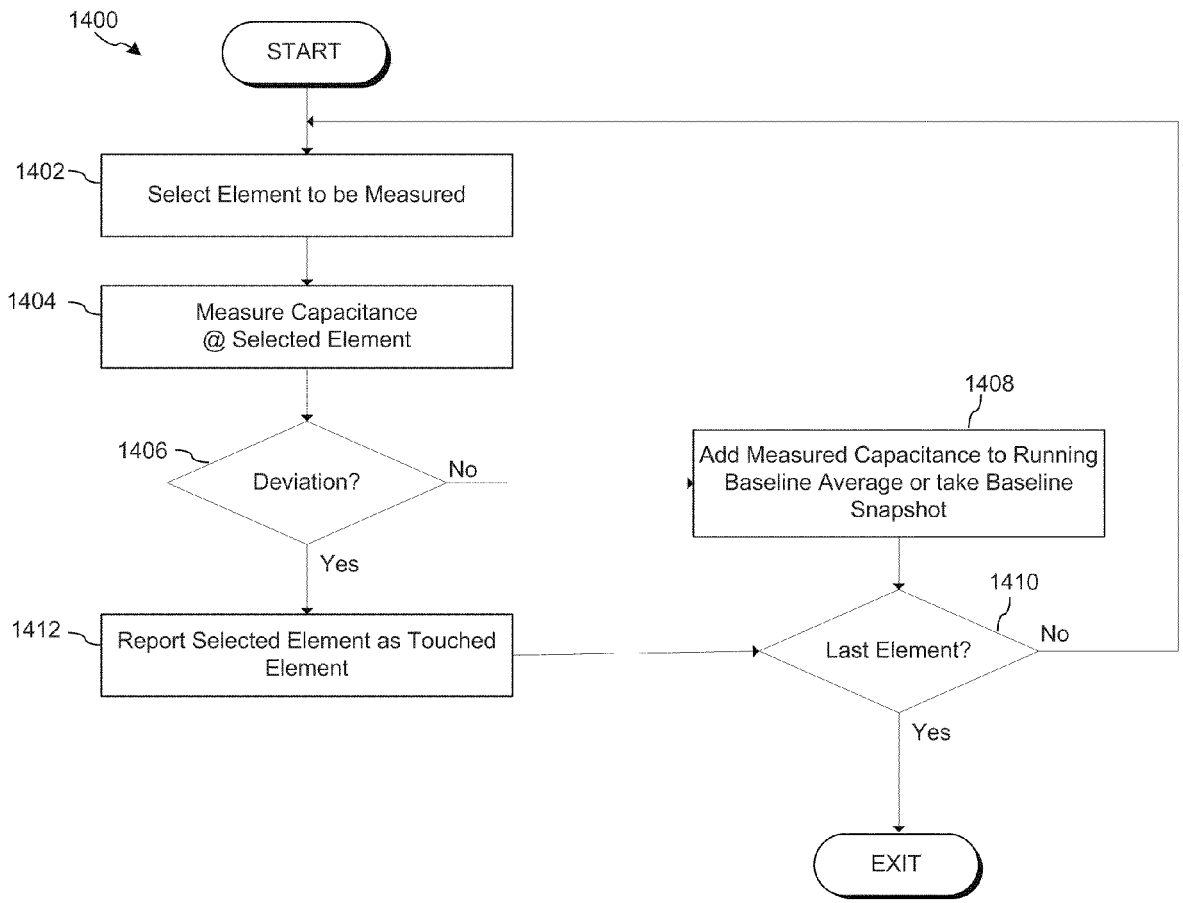
FIG. 14 illustrates a flow chart of an example method for detecting a touch on a touch sensor in a touch sensor system, in accordance with the present disclosure.

FIG. 14 illustrates a flow chart of an example method 1400 for detecting one or more simultaneous touches on a touch sensor 200 in touch sensor system 100, in accordance with the present disclosure.

According to one embodiment, method 1400 preferably begins at step 1402. As noted above, teachings of the present disclosure may be implemented in a variety of configurations of system 100. As such, the preferred initialization point for method 1400 and the order of the steps 1402-1412 comprising method 1400 may depend on the implementation chosen.

At step 1402, touch controller 400 may select a conductive element of touch sensor 200 to be measured. For example, touch controller 400 may set a control signal that electrically connects a selected sensor element X1-X7 or Y1-Y7 to capacitance measuring circuit 500. At step 1404, touch controller 400 may measure the capacitance of the connected sensor element according to the methods described above. For example, touch controller 400 may use the frequency measurement method or the period measurement method to measure the frequency of relaxation oscillator circuit 600. Alternatively, touch controller 400 may use the VACST method of the TCSV method to measure the charge time-to-voltage of charge time measurement circuit 1200.

At step 1406, touch controller 400 determines whether the measured capacitance (that is, as represented by the frequency, period, charge time, or voltage, as appropriate depending on the measurement method) indicates a deviation from the natural capacitance of the selected sensor element. In order to do this, touch controller may store a running baseline average representing the average capacitance of a given conductive element. This running baseline average may be used to eliminate noise created by changes in temperature, voltage, and environment. Accordingly, touch sensor 400 may compare the measured capacitance with the baseline average. In one embodiment, touch controller 400 determines that a deviation is present if the capacitance measurement is different than the baseline average. In another embodiment, touch controller 400 determines that a deviation is present if the capacitance measurement differs from the baseline average more than a pre-defined threshold value.

If no capacitance deviation is detected at step 1406, touch controller 400 determines that no touch is present and proceeds to step 1408. According to an exemplary embodiment, at step 1408 touch controller 400 may add the measured capacitance to the running baseline average. Thus, the baseline averaging system may be a "gated" system, so that the system keeps track of the presence/absence of noise in any operating range, and disables the baseline averaging whenever noise affects even a single sensor. This may ensure that the baseline average reflects the natural capacitance of the selected electrode rather than the capacitance as affected by noise, etc. Further, a fairly slow averaging method (e.g., step 1408 is not performed for every scanning cycle) may be implemented if avoiding averaging deviations with a slow slope is desired (e.g., as would be present when an object approaches touch screen 200 very slowly). According to an alternative embodiment, at step 1408 touch controller 400 may simply take a baseline snapshot selected element such that the snapshot becomes the new baseline for the next measurement cycle.

After step 1408 is complete, touch controller 400 may proceed to step 1410 where it may determine if the currently selected conductive element is the last element to be measured. If the currently selected conductive element is the last element to be measured, method 1400 may exit. If the currently selected conductive element is not the last element to be measured, method 1400 may loop back to step 1402 where the next conductive element is selected, and the previous steps repeated for the newly selected conductive element.

If a capacitance deviation is detected at step 1406, touch controller 400 determines that a touch condition is present and reports the selected element as a touched element (for example, to host 800). Touch controller may then proceed to step 1410, as described above.

Figure 14A:
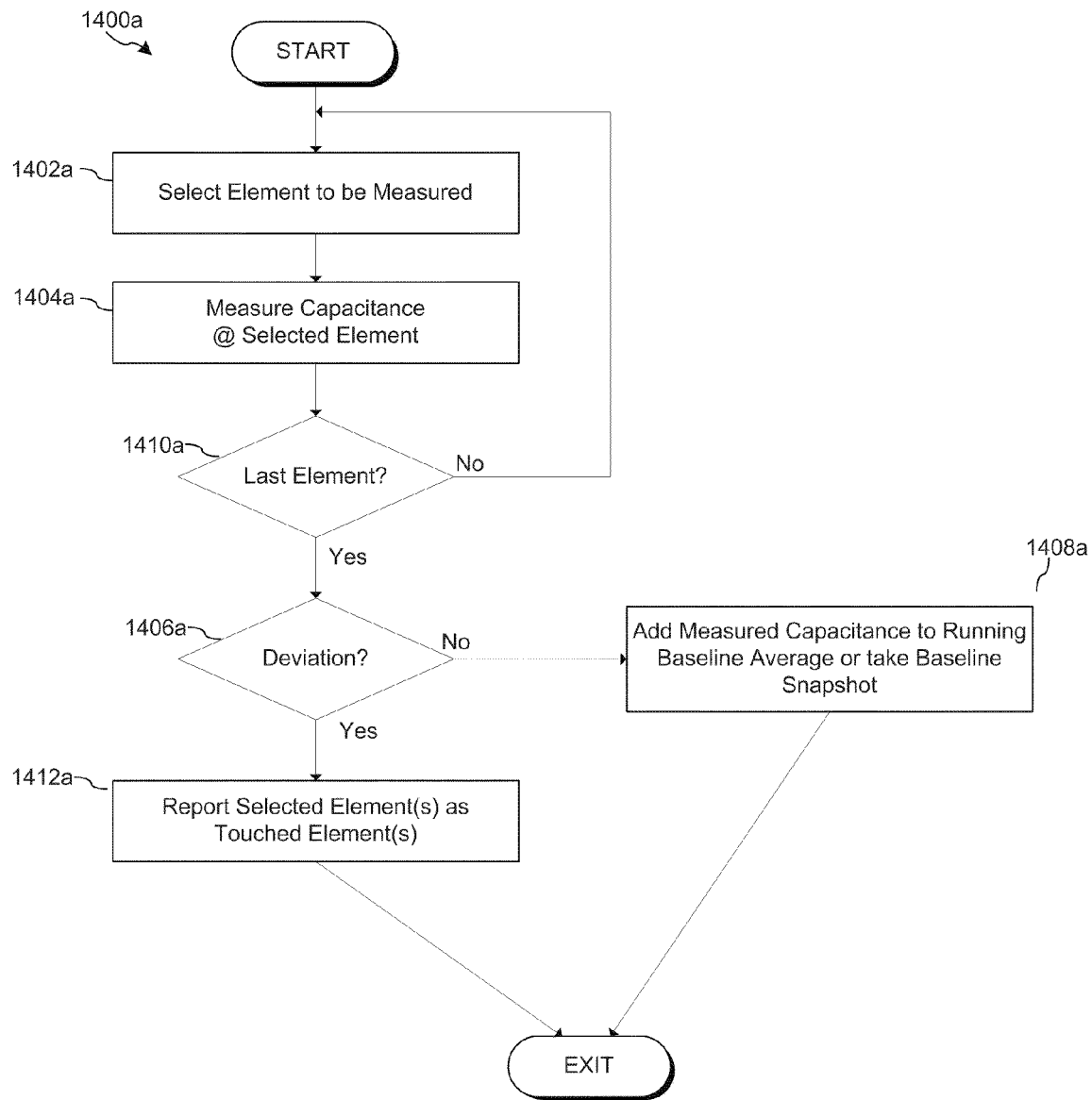
FIG. 14a illustrates a flow chart of an example method for detecting a touch on a touch sensor in a touch sensor system, in accordance with the present disclosure.

Although FIG. 14 discloses a particular number of steps to be taken with respect to method 1400, method 1400 may be executed with greater or lesser steps than those depicted in FIG. 14. For example, method 1400 may omit step 1408 and may not keep a running baseline average of capacitance values. In this case, a "No" condition at step 1406 would cause touch controller 400 to proceed to step 1410. While this specific deviation to method 1400 is explicit, others may be made. In addition, although FIG. 14 discloses a certain order of steps to be taken with respect to method 1400, the steps comprising method 1400 may be completed in any suitable order. For example, reporting step 1402 may be deferred until an affirmative answer is provided to the condition in step 1410 (e.g., all touched elements may be reported at once—after all elements have been measured). Similarly, the baseline step 1408 may also be deferred until step 1410 returns "Yes." Such an alternative embodiment is depicted in FIG. 14a, which illustrates a flow chart of an example method 1400a for detecting one or more simultaneous touches on a touch sensor 200 in touch sensor system 100. Each step in FIG. 14a may correspond to a like-numbered step illustrated and described with respect to FIG. 14, and illustrates that the steps taken with respect to method 1400 may be completed in any suitable order, in addition to the order depicted in FIGS. 14 and 14a.

Figure 15:
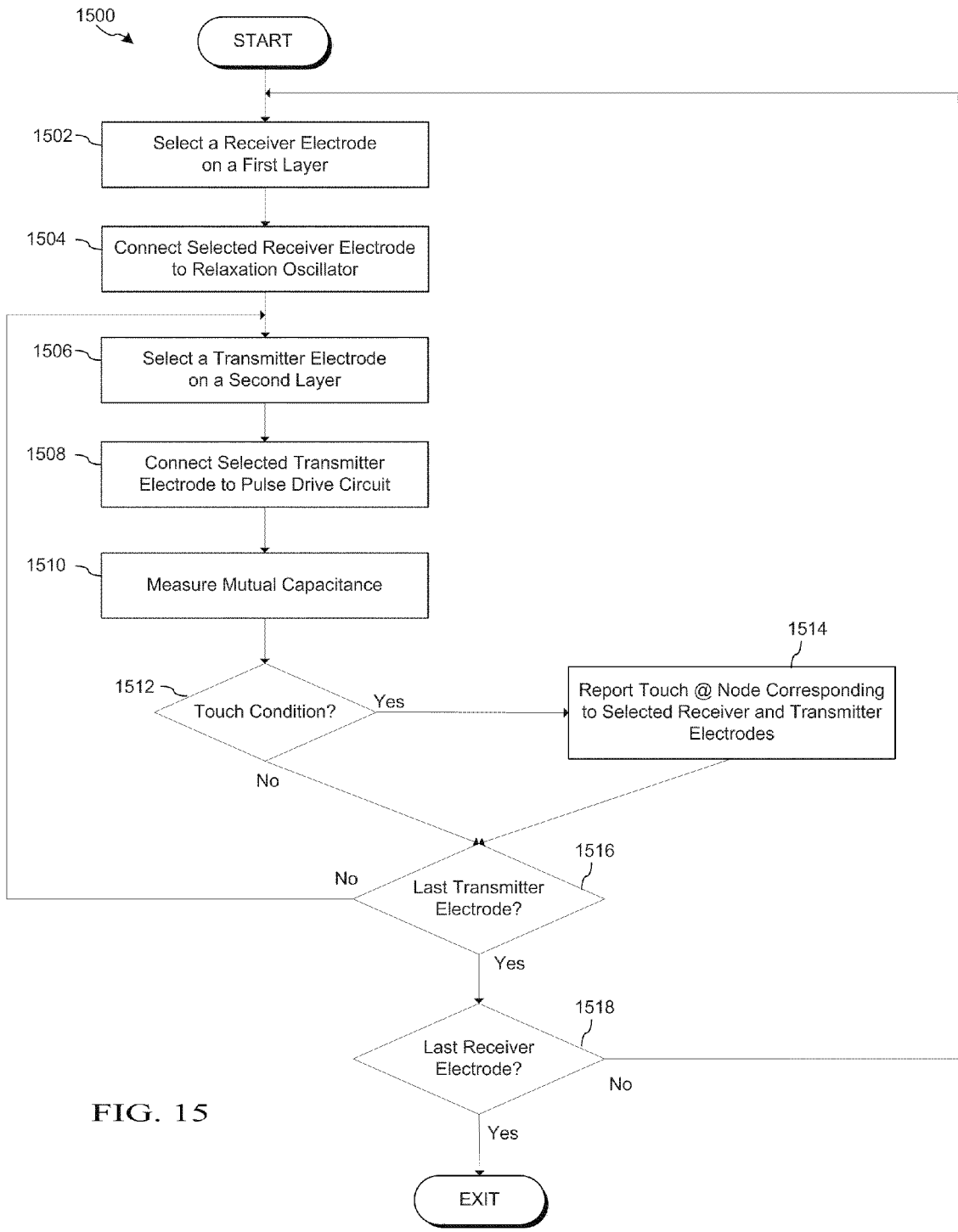
FIG. 15 illustrates a flow chart of an example method for detecting a touch on a touch sensor in a touch sensor system, in accordance with the present disclosure.

FIG. 15 illustrates a flow chart of an example method 1500 for detecting one or more simultaneous touches on a touch sensor 200 in touch sensor system 100, in accordance with the present disclosure.

According to one embodiment, method 1500 preferably begins at step 1502. As noted above, teachings of the present disclosure may be implemented in a variety of configurations of system 100. As such, the preferred initialization point for method 1500 and the order of the steps 1502-1518 comprising method 1500 may depend on the implementation chosen.

At step 1502, touch controller 400 may select a receiver electrode on a first layer of touch sensor 200. At step 1504, touch controller 400 may connect the selected receiver electrode to relaxation oscillator circuit 600. For example, touch controller 400 may set a control signal that electrically connects the selected receiver electrode (that is, one of X1-X7 or Y1-Y7) to relaxation oscillator circuit 600. At step 1506, touch controller 400 may select a transmitter electrode on a second layer of touch sensor 200. At step 1508, touch controller 400 may connect the selected transmitter electrode to pulse drive circuit 1012. For example, touch controller 400 may set a control signal that electrically connects the selected transmitter electrode (that is, one of X1-X7 or Y1-Y7) to pulse drive circuit 1012.

At step 1510, touch controller 400 may measure the mutual capacitance between the selected receiver and transmitter electrodes. According to certain exemplary embodiments, this measurement may be performed according to the frequency measurement method (as described above). In alternative embodiments, this measurement may be performed according to the period measurement method (as described above). At step 1512, touch controller 400 may determine whether the measured mutual capacitance between the selected receiver and transmitter electrodes indicates a touch condition. According to one embodiment, touch controller 400 may subtract the measured mutual capacitance from a previously acquired "no touch" baseline value corresponding to the selected node (that is, the intersection between the selected receiver and transmitter electrodes). Touch controller may determine that a touch condition has occurred if the change in the node's mutual capacitance compared to the "no touch" baseline exceeds a predefined threshold value. This predetermined threshold value may be ZERO such that any change is reported as a touch, or it may be a higher threshold value, for example, to account for noise, parasitics, etc.

If touch controller 400 determines that a touch condition has occurred, touch controller may proceed to step 1514 and may report a touch condition at the node corresponding to the selected transmitter and receiver electrodes. According to certain exemplary embodiments, the reporting in step 1514 may occur immediately, for example, by sending a touch report (for example, an (X,Y) coordinate), to host 800 of FIG. 1. In alternative embodiments, the reporting step 1514 may comprise storing an indication of the touch condition (for example, an (X,Y) coordinate) in storage element 1010 of FIG. 10. According to this alternative embodiment, touch controller 400 may send the report to host 800 at a later point in time, for example, after a predetermined delay, periodically, or in response to a request from host 800. In this manner, touch controller 400 may report one or more touch conditions at a time (for example, multiple touch conditions may be reported to host 800 at the same time after they are stored in storage element 1010).

If touch controller 400 determines in step 1512 that no touch condition has occurred, touch controller may proceed to step 1516, where it may determine whether each of the electrodes on the second layer has served as a transmitter electrode for the selected receiver electrode. If each of the electrodes on the second layer have not served as a transmitter electrode, touch controller 400 may proceed to step 1506, wherein it may select the next electrode in the second layer to act as the transmitter electrode. If each of the electrodes on the second layer have served as a transmitter electrode, touch controller 400 may proceed to step 1518, where it may determine whether each of the electrodes on the first layer have served as a receiver electrode. If each of the electrodes on the first layer have not served as a receiver electrode, touch controller 400 may return to step 1502, where it may select the next electrode on the first layer to act as the receiver electrode. If each of the electrodes on the first layer have served as a receiver electrode, touch controller 400 may exit.

Although FIG. 15 discloses a particular number of steps to be taken with respect to method 1500, method 1500 may be executed with greater or lesser steps than those depicted in FIG. 15. For example, method 1500 may include a step similar to step 1408 in FIG. 14 in which touch controller stores a running baseline average of the measured capacitance at each node. As another example, instead of exiting as described above, touch controller 400 may simply return to step 1502, having re-set the receiver and transmitter selection counter to start over at the first transmitter/receiver pair in the loop. In this manner, touch controller 400 may perform method 1500 continuously. In such an implementation, method 1500 may include a delay step in between each iteration of scanning touch screen 200. As still yet another example, method 1500 may include a step (or series of steps) prior to step 1502 wherein touch controller iterates over all nodes on touch screen 200, measuring the mutual capacitance and storing a static baseline value and/or an initial baseline value for the aforementioned running baseline. While these specific deviations to method 1500 are explicit, other unmentioned deviations may be possible.

Figure 15A:
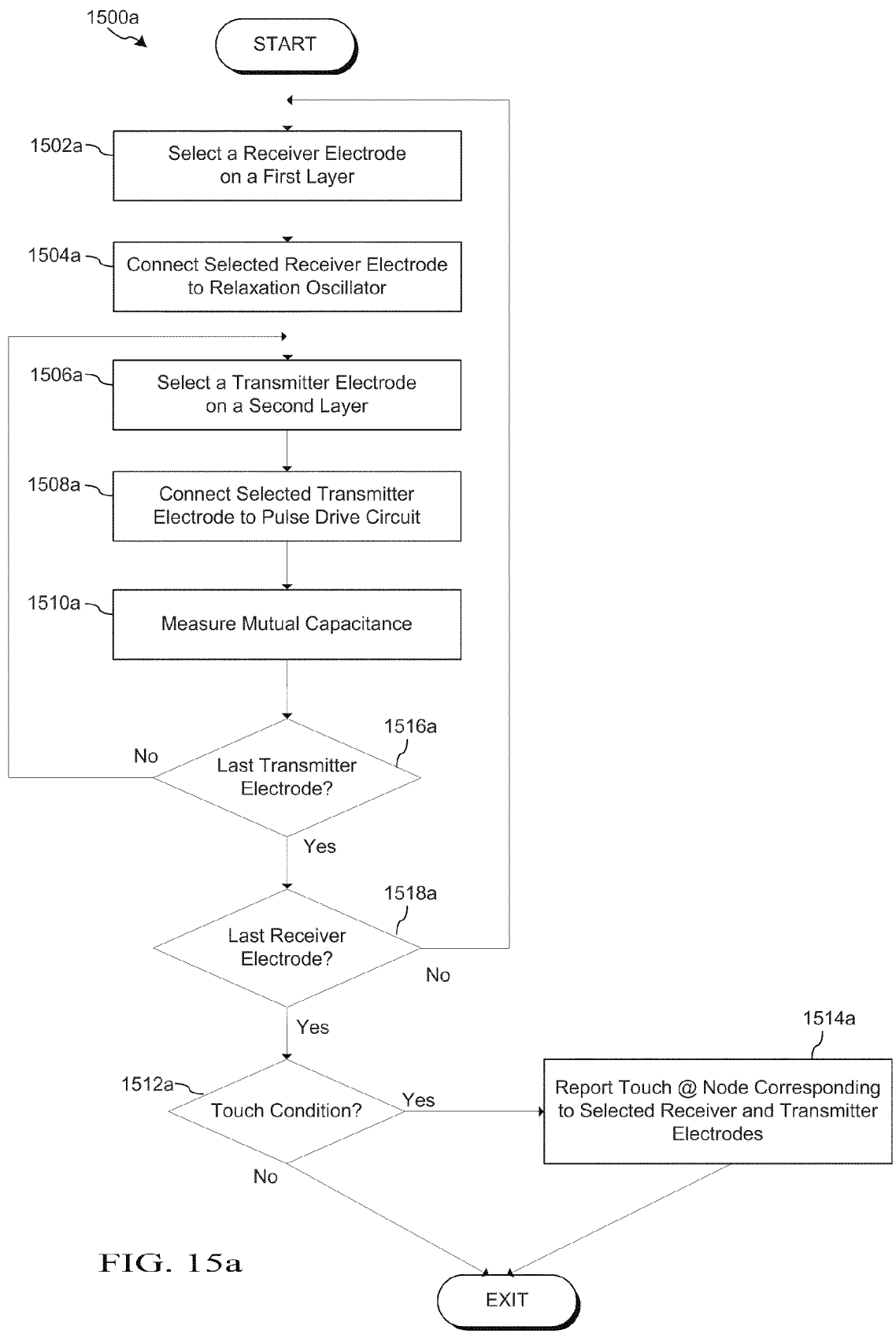
FIG. 15a illustrates a flow chart of an example method for detecting a touch on a touch sensor in a touch sensor system, in accordance with the present disclosure.

In addition, although FIG. 15 discloses a certain order of steps to be taken with respect to method 1500, the steps comprising method 1500 may be completed in any suitable order. For example, steps 1502, 1504, and 1518 may be swapped with steps 1506, 1508, and 1516, respectively. In an alternative embodiment reporting step 1514 may be deferred until after all or a sub-set of nodes have been measured. One example of such an alternative embodiment is depicted in FIG. 15a, which illustrates a flow chart of an example method 1500a for detecting one or more simultaneous touches on a touch sensor 200 in touch sensor system 100. Each step in FIG. 15a may correspond to a like-numbered step illustrated and described with respect to FIG. 15, and illustrates that the steps taken with respect to method 1500 may be completed in any suitable order, in addition to the order depicted in FIGS. 15 and 15a. Again, while this deviation is made explicit, other unmentioned deviations to the order of steps may be possible.

Figure 16:
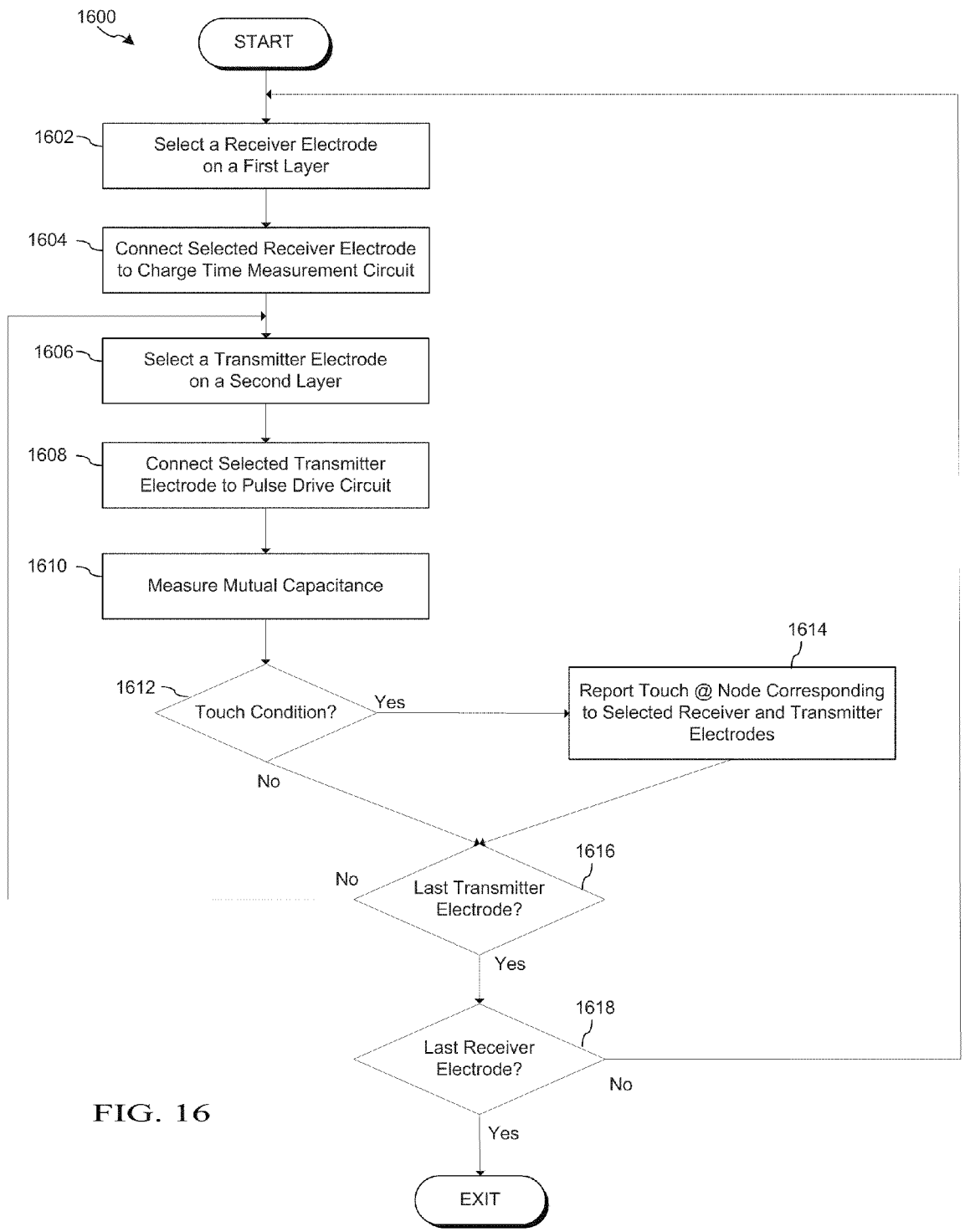
FIG. 16 illustrates a flow chart of an example method for detecting a touch on a touch sensor in a touch sensor system, in accordance with the present disclosure.

FIG. 16 illustrates a flow chart of an example method 1600 for detecting one or more simultaneous touches on a touch sensor 200 in touch sensor system 100, in accordance with the present disclosure. The steps of method 1600 are similar to the steps of method 1500 depicted in FIG. 15. The main differences between the two methods is depicted in steps 1604 and 1610. The disclosure above with respect to the corresponding steps in method 1500 describes the operation for the other steps of method 1600 (that is, steps 1602, 1606, 1608, and 1612-1618), and is therefore not repeated here.

At step 1604, touch controller 400 may connect the selected receiver electrode to charge time measurement circuit 1200. For example, touch controller 400 may set a control signal that electrically connects the selected receiver electrode (that is, one of X1-X7 or Y1-Y7) to charge time measurement circuit 1200.

At step 1610, touch controller 400 may measure the mutual capacitance between the selected receiver and transmitter electrodes. According to certain exemplary embodiments, this measurement may be performed according to the VACST method (as described above). In alternative embodiments, this measurement may be performed according to the TCSV method (as described above).

Although FIG. 16 discloses a particular number of steps to be taken with respect to method 1600, method 1600 may be executed with greater or lesser steps than those depicted in FIG. 16. For example, similar deviations to those described above for method 1500 may be possible. While these deviations to method 1600 are made explicit, other unmentioned deviations may be possible. In addition, although FIG. 16 discloses a certain order of steps to be taken with respect to method 1600, the steps comprising method 1600 may be completed in any suitable order. For example, similar deviations to those described above for method 1500 may be possible. Again, while this deviation is made explicit, other unmentioned deviations to the order of steps may be possible.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for determining multiple touch events in a multi-touch sensor system having a capacitance measurement unit comprising a relaxation oscillator circuit, a pulse drive unit, and a touch sensor having a plurality of nodes and a plurality of electrodes comprising at least two sets of electrodes, the method comprising:
   connecting a first electrode in a first set of electrodes to the relaxation oscillator circuit within the capacitance measurement unit;
   driving, with the pulse drive unit, a voltage or current pulse onto a second electrode in a second set of electrodes each time the relaxation oscillator circuit transitions from a charging state to a discharging state;
   measuring, with the capacitance measurement unit, the mutual capacitance at a node corresponding to the first and second electrodes by measuring a frequency of the relaxation oscillator circuit; and
   comparing the measured mutual capacitance at the node with a previously measured mutual capacitance corresponding to the node by comparing the frequency to a previously measured frequency corresponding to the node and determining whether the frequency deviates from the previously measured frequency;
   reporting that the node has been touched if there has been a deviation from the previously measured frequency.

2. The method of claim 1 wherein the step of measuring a frequency of the relaxation oscillator circuit is according to a period measurement method.

3. The method of claim 2 wherein the system further comprises a counter register, and wherein the step of determining whether the frequency deviates from the previously measured frequency comprises determining whether a time period necessary for a counter register overflow condition has changed.

4. The method of claim 1 wherein the step of determining whether the frequency deviates from the previously measured frequency comprises determining whether the frequency deviates by more than a predetermined threshold.

5. The method of claim 1 wherein the step of measuring a frequency of the relaxation oscillator circuit is according to a frequency measurement method.

6. The method of claim 1 wherein the first set of electrodes corresponds to electrodes on a first layer of the touch sensor, and the second set of electrodes corresponds to electrodes on a second layer of the touch sensor.

7. The method of claim 1 wherein the electrodes in the first and second set of electrodes are on the same layer of the touch sensor.

8. The method of claim 1 wherein the voltage or current pulse corresponds to one of: a negative edge transition of the voltage or current pulse, and a positive edge transition of the voltage or current pulse.

9. The method of claim 1 wherein an opposite voltage or current pulse is driven onto the second electrode each time the relaxation oscillator circuit transitions from a discharging state to a charging state.

10. A method for determining multiple touch events in a multi-touch sensor system having a capacitance measurement unit, a pulse drive unit, a timer and a touch sensor having a plurality of nodes and a plurality of electrodes comprising at least two sets of electrodes, wherein the capacitance measurement unit comprises a voltage or current source, the method comprising:
   connecting a first electrode in a first set of electrodes to the voltage or current source of the capacitance measurement unit;
   driving, with the pulse drive unit, a voltage or current pulse onto a second electrode in a second set of electrodes while the voltage or current source is connected to the first electrode;
   starting the timer and measuring the voltage of the first electrode as a measured voltage when the timer reaches a pre-determined time;
   comparing the measured voltage to a previously measured voltage corresponding to the node; and
   reporting that the node has been touched if the measured voltage deviates from the previously measured voltage.

11. The method of claim 10 wherein the first set of electrodes corresponds to electrodes on a first layer of the touch sensor, and the second set of electrodes corresponds to electrodes on a second layer of the touch sensor.

12. The method of claim 10 wherein the electrodes in the first and second set of electrodes are on the same layer of the touch sensor.

13. The method of claim 10 wherein the voltage or current pulse corresponds to one of: a negative edge transition of the voltage or current pulse, and a positive edge transition of the voltage or current pulse.

14. The method of claim 10 wherein an opposite voltage or current pulse is driven onto the second electrode each time the relaxation oscillator circuit transitions from a discharging state to a charging state.

15. A method for determining multiple touch events in a multi-touch sensor system having a capacitance measurement unit, a pulse drive unit, a timer and a touch sensor having a plurality of nodes and a plurality of electrodes comprising at least two sets of electrodes, wherein the capacitance measurement unit comprises a voltage or current source, the method comprising:
   connecting a first electrode in a first set of electrodes to the voltage or current source;
   driving, with the pulse drive unit, a voltage or current pulse onto a second electrode in a second set of electrodes while the voltage or current source is connected to the first electrode;

starting the timer, measuring the voltage of the first electrode as a measured voltage, and storing the time value of the timer when the measured voltage reaches a predetermined voltage level;

comparing the stored time value to a previously stored value corresponding to the node; and reporting that a node corresponding to the first and second electrodes has been touched if the stored time value deviates from the previously stored value.

16. The method of claim 15 wherein the first set of electrodes corresponds to electrodes on a first layer of the touch sensor, and the second set of electrodes corresponds to electrodes on a second layer of the touch sensor.

17. The method of claim 15 wherein the electrodes in the first and second set of electrodes are on the same layer of the touch sensor.

18. The method of claim 15 wherein the voltage or current pulse corresponds to one of: a negative edge transition of the voltage or current pulse, and a positive edge transition of the voltage or current pulse.

19. The method of claim 15 wherein an opposite voltage or current pulse is driven onto the second electrode each time the relaxation oscillator circuit transitions from a discharging state to a charging state.

20. A system for detecting one or more touch events on a touch sensor, comprising:

a touch sensor having a plurality of nodes and a plurality of electrodes comprising at least a first and second set of electrodes;

a touch controller having a pulse drive circuit selectably coupled to the plurality of electrodes, a timer circuit, a capacitance measurement unit comprising a charge time measurement circuit selectably coupled to the plurality of electrodes and coupled with the timer circuit; and a storage element coupled to the charge time measurement, circuit;

wherein the touch controller is operable to:

measure the mutual capacitance at a node corresponding to a first electrode in the first set of electrodes and a second electrode in the second set of electrodes by:

coupling a voltage or current source in the charge time measurement circuit to the first electrode;

starting the timer circuit;

coupling the second electrode to the pulse drive circuit; and measuring the voltage of the first electrode as a measured voltage when the timer circuit reaches a predetermined time;

compare the mutual capacitance at the node with a previously measured mutual capacitance corresponding to the node by comparing the measured voltage to a previously measured voltage corresponding to the node; and report that the node has been touched if there has been a deviation from the previously measured voltage.

21. The system of claim 20, wherein:

the capacitance measurement unit further comprises a relaxation oscillator-based measurement circuit; and wherein the touch controller is operable to measure the mutual capacitance at the node by utilizing the relaxation oscillator-based measurement circuit and the charge time measurement circuit.

22. The system of claim 21, wherein the touch controller is operable to report that the node has been touched if both the relaxation oscillator-based measurement circuit and the charge time measurement circuit indicate that there has been a deviation from the previously measured mutual capacitance.

23. A system for detecting one or more touch events on a touch sensor, comprising:

a touch sensor having a plurality of nodes and a plurality of electrodes comprising at least a first and second set of electrodes;

a touch controller having a pulse drive circuit selectably coupled to the plurality of electrodes, a timer circuit, a capacitance measurement unit comprising a charge time measurement circuit selectably coupled to the plurality of electrodes and coupled with the timer circuit; and a storage element coupled to the charge time measurement circuit;

wherein the touch controller is operable to measure the mutual capacitance at a node by:

coupling a voltage or current source in the charge time measurement circuit to the first electrode;

starting the timer circuit;

coupling the second electrode to the pulse drive circuit;

measuring the voltage of the first electrode as a measured voltage; and storing, in the storage element, the time value of the timer circuit when the measured voltage reaches a predetermined voltage level;

wherein the touch controller compares the mutual capacitance at the node by comparing the stored time value to a previously stored time value corresponding to the node; and wherein the touch controller reports that the node corresponding has been touched if the stored time value deviates from the previously stored time value.

24. A system for detecting one or more touch events on a touch sensor, comprising:

a touch sensor having a plurality of nodes and a plurality of electrodes comprising at least a first and second set of electrodes;

a touch controller having a pulse drive circuit, and a relaxation oscillator-based measurement circuit;

wherein the touch controller is operable to measure the mutual capacitance at a node by:

coupling the relaxation oscillator-based measurement circuit to a first electrode in the first set of electrodes;

coupling a second electrode in the second set of electrodes to the pulse drive circuit; and measuring the frequency of the relaxation oscillator-based measurement circuit;

wherein the touch controller compares the mutual capacitance at the node by comparing the frequency to a previously measured frequency corresponding to the node and determines whether the frequency deviates from the previously measured frequency; and wherein the touch controller reports that the node has been touched if there has been a deviation from the previously measured frequency.

* * * * *